US012760416B2

(12) United States Patent
Lehn et al.

(10) Patent No.: US 12,760,416 B2
(45) Date of Patent: Oct. 13, 2026

(54) METHODS FOR DEPOSITING GERMANIUM FILMS BY ATOMIC LAYER DEPOSITION

(71) Applicant: Micron Technology, Inc., Boise, ID (US)

(72) Inventors: Jean-Sebastien Materne Lehn, Boise, ID (US); Francois H. Fabreguette, Boise, ID (US); Timothy A. Quick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 18/784,827

(22) Filed: Jul. 25, 2024

(65) Prior Publication Data

US 2025/0059646 A1 Feb. 20, 2025

Related U.S. Application Data

(60) Provisional application No. 63/519,788, filed on Aug. 15, 2023.

(51) Int. Cl.
*C23C 16/455* (2006.01)
*H10P 14/20* (2026.01)
*H10P 14/24* (2026.01)

(52) U.S. Cl.
CPC .. *C23C 16/45553* (2013.01); *C23C 16/45527* (2013.01); *H10P 14/24* (2026.01); *H10P 14/3411* (2026.01)

(58) Field of Classification Search
None
See application file for complete search history.

(56) References Cited

U.S. PATENT DOCUMENTS

2009/0321733 A1 12/2009 Gatineau et al.
2014/0220733 A1* 8/2014 Hunks .................... C07F 7/003 438/102
2014/0308802 A1 10/2014 Xiao et al.
(Continued)

OTHER PUBLICATIONS

Gordon ("ALD Precursors and Reaction Mechanisms", obtained online at https://cns.fas.harvard.edu/documents/2018/06/ald-precursors-reaction-mechanisms.pdf/; prior art date of Jun. 2018 from hyperlink) (Year: 2018).*
(Continued)

*Primary Examiner* — Michael G Miller
(74) *Attorney, Agent, or Firm* — Holland & Hart LLP

(57) ABSTRACT

Methods, systems, and devices for methods for depositing germanium films by atomic layer deposition are described. For instance, a device may expose a base material (e.g., multiple stacks of materials) to a first precursor to form a germanium compound on the base material, the first precursor including a germanium amidinate. In some examples, the germanium compound may include germanium and at least one leaving group. The device may react a second precursor with the germanium compound and may form a layer of germanium on the base material based on exposing the base material to the first precursor and reacting the second precursor with the germanium compound. In some examples, the device may remove the at least one leaving group from the germanium compound based on reacting the second precursor with the germanium compound.

25 Claims, 8 Drawing Sheets

(56) References Cited

U.S. PATENT DOCUMENTS

| | | | | |
|---|---|---|---|---|
| 2020/0251334 | A1* | 8/2020 | Fabreguette | H01L 21/0259 |
| 2021/0262084 | A1* | 8/2021 | Knisley | C23C 16/4408 |

OTHER PUBLICATIONS

"International Search Report and Written Opinion of the International Searching Authority," issued in connection with Int'l Appl. No. PCT/US2024/039770, dated Nov. 21, 2024 (13 pages).

Chlupaty, T., et al., "Reactivity of lithium n-butyl amidinates towards group 14 metal(ii) chlorides providing series of hetero- and homoleptic tetrylenes", Dalton Transactions, vol. 41, 2012, pp. 5010-5019.

* cited by examiner

METHODS FOR DEPOSITING GERMANIUM FILMS BY ATOMIC LAYER DEPOSITION

CROSS REFERENCE

The present Application for Patent claims priority to U.S. Patent Application No. 63/519,788 by Lehn et al., entitled "METHODS FOR DEPOSITING GERMANIUM FILMS BY ATOMIC LAYER DEPOSITION," filed Aug. 15, 2023, which is assigned to the assignee hereof, and which is expressly incorporated by reference in its entirety herein.

TECHNICAL FIELD

The following relates to one or more systems for memory, including methods for depositing germanium films by atomic layer deposition.

BACKGROUND

Atomic layer deposition (ALD) is a technique used to deposit a film on a first material. For instance, performing ALD may include exposing the first material to a first precursor to form a second material on the first material. Additionally, performing ALD may include exposing the second material to a second precursor, where the second precursor may react with the second material to leave a third material on the surface of the first material. In some examples, the process may repeat, where the third material may be exposed to the first precursor to form another instance of the second material on the third material, and then the other instance of the second material may be exposed to the second precursor to leave another instance of the third material on the surface of the previously formed instance of the third material.

In some examples, reactions involved in ALD may occur at various temperatures. However, if such temperatures are outside of a predefined range for a threshold duration, other materials in a vicinity to the material being exposed to ALD may experience a change in physical or chemical properties beyond an expected threshold. Such changes in physical or chemical properties may adversely affect an operation of an electronic device that includes these other materials (e.g., may decrease a lifetime of the electronic device, may increase a likelihood that the electronic device displays errant behavior or does not perform its intended function). For some materials, the temperature in order to facilitate reactions (e.g., for forming the third material) in ALD may exceed the predefined range for the threshold duration. Accordingly, materials whose reactions may be facilitated to be within the predefined range or to be outside of the predefined range for less than the predefined duration, may decrease a likelihood that the operation of the electronic device is adversely affected.

DETAILED DESCRIPTION

In some examples, a germanium film may be deposited on a material by performing ALD with a silicon-based precursor. However, in order for the germanium film to form on the material, the ambient temperature may be set with a high enough value such that physical or chemical characteristics of other materials in the same vicinity as the material may be adversely affected. For instance, the electronic device may be more likely to display errant behavior or may not perform its intended function due to a change in the physical or chemical properties of such materials. Accordingly, a precursor capable of forming the germanium film at a lower temperature may decrease a likelihood that the operation of the electronic device is adversely affected.

As described in the present disclosure, precursors that include germanium amidinate may enable formation of germanium films at a lower temperature as compared to other precursors including germanium, as the reactivity of germanium amidinate may be higher than these other precursors. Additionally, precursors including particular types of germanium amidinate may enable formation of germanium films at a lower temperatures (e.g., below 300 degrees Celsius, below 250 degrees Celsius, below 150 degrees Celsius) as compared to other precursors that include other types of germanium amidinate. Additionally or alternatively, such precursors may enable an increased rate of formation of germanium films for a given temperature as compared to these other precursors.

In one example of the methods disclosed herein, the method may include exposing a base material to a first precursor to form a germanium compound on the base material, where the germanium compound includes a germanium and at least one leaving group. Additionally, the method may include reacting a second precursor with the germanium compound and forming a layer of germanium on the base material based on exposing the base material to the first precursor and reacting the second precursor with the germanium compound. In some examples, the method may include removing the at least one leaving group from the germanium compound based on reacting the second precursor with the germanium compound.

Features of the disclosure are initially described in the context of an ALD process and a material deposition process as described with reference to FIGS. 1 and 2. Features of the disclosure are described in the context of an electronic device and a material deposition mechanism as described with reference to FIGS. 3 and 4. These and other features of the disclosure are further illustrated by and described with reference to an apparatus diagram and flowcharts that relate to methods for depositing germanium films by atomic layer deposition as described with reference to FIGS. 5 through 8.

Figure 1:
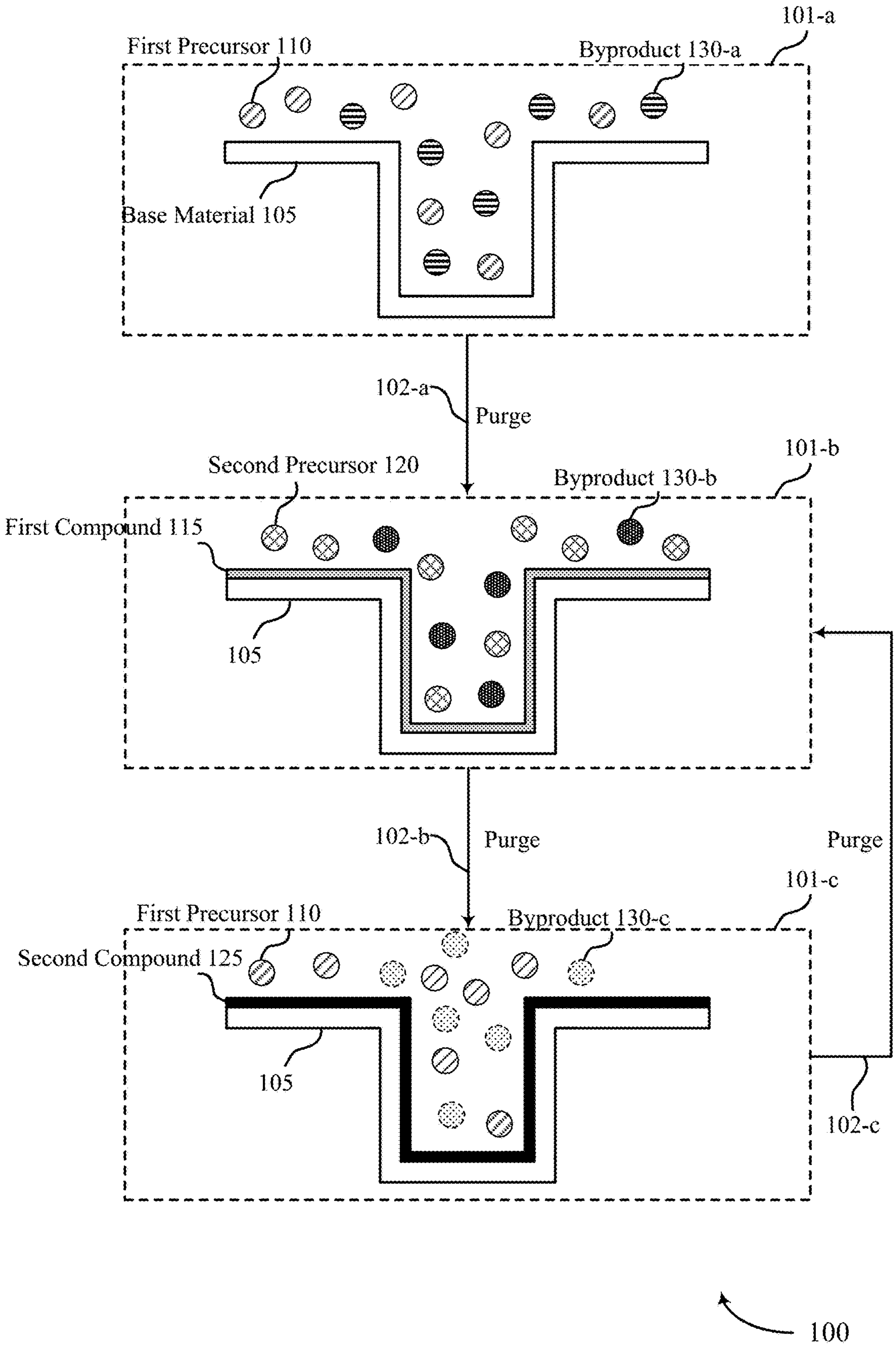
FIG. 1 shows an example of an atomic layer deposition (ALD) process that supports methods for depositing germanium films by atomic layer deposition in accordance with examples as disclosed herein.

FIG. 1 illustrates an example of an ALD process 100 that supports methods for depositing germanium films by atomic layer deposition in accordance with examples as disclosed herein.

As illustrated in stage 101-*a*, a base material 105 may be exposed to a first precursor 110. For instance, the base material 105 may be located in a reactor (e.g., deposition chamber) within which a gaseous phase of the first precursor 110 may be introduced. Exposing the base material to the first precursor may enable a first compound 115 to form on the surface of the base material 105, as depicted in stage 101-*b*. In some examples, as a result of the reaction between base material 105 and first precursor 110, a byproduct 130-*a* will be formed. After forming first compound 115, a byproduct 130-*a* may be formed; in that case, the byproduct 130-*a* and/or a portion of the first precursor 110 may be purged (e.g., removed from the reactor) at 102-*a* before proceeding to stage 101-*b*. In some examples, the temperature of the reactor may be set or adjusted to a first predefined value such that the first compound 115 forms on the surface of the base material 105. In some examples, the base material may be a substrate. In some examples, exposing a material to a precursor may refer to adding the precursor to the reactor within which the material is located, whereas reacting the material with the precursor may refer to a chemical reaction that occurs between the precursor and the material and may involve setting or adjusting a temperature of the reactor to a particular temperature that facilitates the reaction.

After forming the first compound 115 at stage 101-*a*, the first compound 115 may be exposed to a second precursor 120 at stage 101-*b*. For instance, a gaseous phase of the second precursor 120 may be introduced into the reactor and exposed to the surface of the first compound 115. In some examples, the base material 105 may be transported to a second reactor for introducing the second precursor 120. In other examples, the same reactor may be used. The second precursor 120 may react with the first compound 115 to form a second compound 125, as shown in stage 101-*b*. In some examples, as a result of the reaction between first compound 115 and second precursor 120, a byproduct 130-*b* will be formed. After forming second compound 125, the byproduct 130-*b* and/or at least a portion of the second precursor 120 may be purged (e.g., removed from the reactor) at 102-*b* before proceeding to stage 101-*c*. In some examples, the temperature of the reactor may be set or adjusted to a second predefined value such that the second compound 125 forms on the surface of the base material 105.

After forming the second compound 125 at stage 101-*b*, the second compound 125 may be exposed to a first precursor 110 at stage 101-*c*. For instance, a gaseous phase of the first precursor 110 may be introduced to the reactor and exposed to the surface of the second compound 125. In some examples, the base material 105 may be transported to a third reactor for introducing the first precursor 110. In other examples, the same reactor may be used for stage 101-*c* as used for one or both of stages 101-*a* and 101-*b*. The first precursor 110 may react with the second compound 125 to form a second instance of the first compound 115 on top of the second compound 125. In some examples, as a result of the reaction between second compound 125 and first precursor 110, a byproduct 130-*c* will be formed. After forming the second instance of first compound 115, the byproduct 130-*c* and/or at least a portion of the first precursor 110 may be purged (e.g., removed from the reactor) at 102-*c* before returning back to stage 101-*b*. In some examples, the temperature of the reactor may be set or adjusted to the first predefined value or a third predefined value such that the first compound 115 forms on the surface of the base material 105. In some examples, first precursor 110 and second precursor 120 may be delivered to the reactor (e.g., or reactors) using an inert gas (e.g., argon, helium, nitrogen). Additionally or alternatively, the byproducts 130-*a*, 130-*b* and/or 130-*c* may be purged using an inert gas (e.g., argon, helium, nitrogen).

In some examples, the process may be repeated to deposit multiple layers of the second compound 125. For instance, after depositing a first instance of second compound 125, the first instance of the second compound 125 may be exposed to the first precursor 110 to form a second instance of the first compound 115 on a surface of the first instance of the second compound 125. Then, the second instance of the first compound 115 may be exposed to the second precursor 120 to form a second instance of the second compound 125 on the surface of the first instance of the second compound 125.

In some examples, the first compound 115 may include a germanium compound, where the germanium compound includes a germanium and at least one leaving group. In some such examples, the first precursor may have the chemical formula $Ge(AMD)_2$, where Ge corresponds to germanium and AMD corresponds do amidinate. In some such examples, the first precursor may have the following formula:

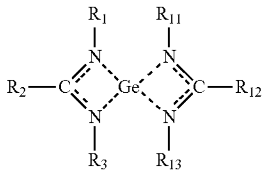

where $R_1$, $R_3$, $R_{11}$, and $R_{13}$ each include sat least one of methyl, ethyl, propyl, butyl, iso-propyl, linear alkyl, branched alkyl, aryl, or hexyl alkyl, where $R_2$ and $R_{12}$ each include at least one of hydrogen, methyl, ethyl, propyl, butyl, iso-propyl, linear alkyl, branched alkyl, aryl, hexyl alkyl, octyl alkyl, or a dialkylamino, where C corresponds to carbon, and where N corresponds to nitrogen. In some examples, the dialkylamino includes a dimethylamino, a diethylamino, or a methylethylamino. In some examples, each of $R_1$, $R_3$, $R_{11}$, and $R_{13}$ are ethyl and each of $R_2$ and $R_{12}$ are hydrogen. Alternatively, each of $R_1$, $R_3$, $R_{11}$, and $R_{13}$ are ethyl and each of $R_2$ and $R_{12}$ are methyl.

Alternatively, the first precursor may have a chemical formula given as X—Ge(AMD), where Ge corresponds to germanium, AMD corresponds do amidinate, and X includes an alkoxide, an alkylsulfide, an alkylselenide, an alkyltelluride, an amide including two substituents, a hydrazide comprising three substituents, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, a halide, or any combination thereof. In some such examples, the first precursor may have the following chemical formula:

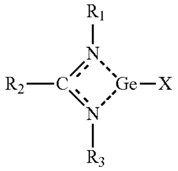

where $R_1$ and $R_3$ each include at least one of methyl, ethyl, propyl, butyl, secondary butyl, tertiary butyl, iso-propyl, linear alkyl, branched alkyl, or hexyl alkyl, where $R_2$ includes at least one of hydrogen, deuterium, methyl, ethyl, propyl, butyl, secondary butyl, tertiary butyl, iso-propyl, linear alkyl, branched alkyl, hexyl alkyl, octyl alkyl, where C corresponds to carbon, and where N corresponds to nitrogen.

In some examples, the second precursor 120 may include ammonia or an alcohol. Additionally or alternatively, the second precursor 120 may have the chemical formula YH, where H may be a hydrogen, and Y may be an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide, where the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents. Additionally or alternatively, the second precursor 120 may have the chemical formula $Y—ZR_1R_2R_3$, where Y may be an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide, where the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents. In some examples, Z may be independently selected from silicon, germanium, or tin. In some examples, each of $R_1$, $R_2$, and $R_3$ may be independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, a $—SiR_aR_bGeR_cR_dR_e$ moiety, or a moiety including carbon atoms, silicon atoms, germanium atoms, or tin atoms, or any combination thereof. In some such examples, each atom of the carbon atoms, silicon atoms, germanium atoms, tin atoms, or any combination thereof may be fully saturated by having 4 bonds with respective substituents $R_a$ through $R_x$ or at least one other of the carbon atoms, silicon atoms, germanium atoms, tin atoms, or any combination thereof. Additionally or alternatively, up to 10 atoms of the carbon atoms, silicon atoms, germanium atoms, tin atoms, or any combination thereof are distinct from any carbon atoms, silicon atoms, germanium atoms, or tin atoms of $R_a$ through $R_x$. Additionally or alternatively, $R_a$ through $R_x$ may be independently selected from hydrogen, deuterium, an alkyl group, or an aryl group. In some examples, x of $R_x$ is an index distinct from a of $R_a$.

In some examples, the base material 105 may be a structure on a substrate (e.g., a wafer). In some such examples, the base material 105 may span in a first direction and a second direction, where the first direction is orthogonal to the second direction. Additionally, a memory device including the base material 105 may include word lines extending along the first direction and/or the second direction and bit lines extending along a third direction orthogonal to the first direction and the second direction. In some such examples, a stack of materials (e.g., a sequence of materials) may be formed in one or more recesses of the word lines, where the stack may extend along the first direction and/or the second direction and where the sequence of materials may include a memory cell (e.g., a chalcogenide element). In some examples, the techniques described herein may be used to form a compound on the base material 105, the word lines, the bit lines, the stacks, or any combination thereof.

In some examples, the reacting at 101-*a* through 101-*c* may occur at a temperature below 300 degrees Celsius. Additionally, the reacting at 101-*a* through 101-*c* may occur at a temperature below 250 degrees Celsius or at a temperature below 150 degrees Celsius. In some examples, the reacting occurring below one or more of these temperatures may be due to the associated reaction being more exothermic and/or exhibiting increased reactivity as compared to when other precursors are utilized. For instance, the reaction may be more exothermic and/or increased reactivity may be observed as compared to when precursors not containing amidinate are utilized. Additionally or alternatively, the reaction may be more exothermic and/or increased reactivity may be observed when the precursor contains one type of amidinate as compared to another type of amidinate. For instance, the reaction may be more exothermic and/or increased reactivity may be observed when $R_1$ and $R_3$ of the first precursor (e.g., as well as $R_{11}$ and $R_{13}$) include ethyl and $R_2$ (e.g., as well as $R_{12}$) of the first precursor includes hydrogen or methyl as compared to when the first precursor includes $R_1$ and $R_3$ include isopropyl and $R_2$ includes butyl (e.g., n-butyl). Similarly, the reaction may be exothermic and/or increased reactivity may be observed when $R_1$, $R_2$, and $R_3$ (e.g., as well as $R_{11}$, $R_{12}$, and $R_{13}$) are tertiary butyl; when $R_1$ and $R_3$ (e.g., as well as $R_{11}$ and $R_{13}$) are isopropyl and $R_2$ (e.g., as well as $R_{12}$) is tertiary butyl; when $R_1$ and $R_3$ (e.g., as well as $R_{11}$ and $R_{13}$) are tertiary butyl and $R_2$ (e.g., as well as $R_{12}$) is ethyl; when $R_1$ and $R_3$ (e.g., as well as $R_{11}$ and $R_{13}$) are tertiary butyl and $R_2$ (e.g., as well as $R_{12}$) is isopropyl; when $R_1$ and $R_3$ (e.g., as well as $R_{11}$ and $R_{13}$) are tertiary butyl and $R_2$ (e.g., as well as $R_{12}$) is methyl; when $R_1$ and $R_3$ (e.g., as well as $R_{11}$ and $R_{13}$) are ethyl and $R_2$ (e.g., as well as $R_{12}$) is butyl (e.g., n-butyl); when $R_1$, $R_2$, and $R_3$ (e.g., as well as $R_{11}$, $R_{12}$, and $R_{13}$) are isopropyl; when $R_1$ and $R_3$ (e.g., as well as $R_{11}$ and $R_{13}$) are methyl and $R_2$ (e.g., as well as $R_{12}$) is butyl (e.g., n-butyl); when $R_1$ and $R_3$ (e.g., as well as $R_{11}$ and $R_{13}$) are isopropyl and $R_2$ (e.g., as well as $R_{12}$) is methyl; when $R_1$ and $R_3$ (e.g., as well as $R_{11}$ and $R_{13}$) are isopropyl and $R_2$ (e.g., as well as $R_{12}$) is hydrogen; when $R_1$, $R_2$, and $R_3$ (e.g., as well as $R_{11}$, $R_{12}$, and $R_{13}$) are methyl; when $R_1$ and $R_3$ (e.g., as well as $R_{11}$ and $R_{13}$) are ethyl and $R_2$ (e.g., as well as $R_{12}$) is hydrogen; when $R_1$ and $R_3$ (e.g., as well as $R_{11}$ and $R_{13}$) are ethyl and $R_2$ (e.g., as well as $R_{12}$) is methyl; when $R_1$ and $R_3$ (e.g., as well as $R_{11}$ and $R_{13}$) are tertiary-butyl and $R_2$ (e.g., as well as $R_{12}$) is hydrogen; or when $R_1$ and $R_3$ (e.g., as well as $R_{11}$ and $R_{13}$)

are methyl and $R_2$ (e.g., as well as $R_{12}$) is hydrogen as compared to when the first precursor includes $R_1$ and $R_3$ include isopropyl and $R_2$ includes butyl (e.g., n-butyl).

Figure 2:
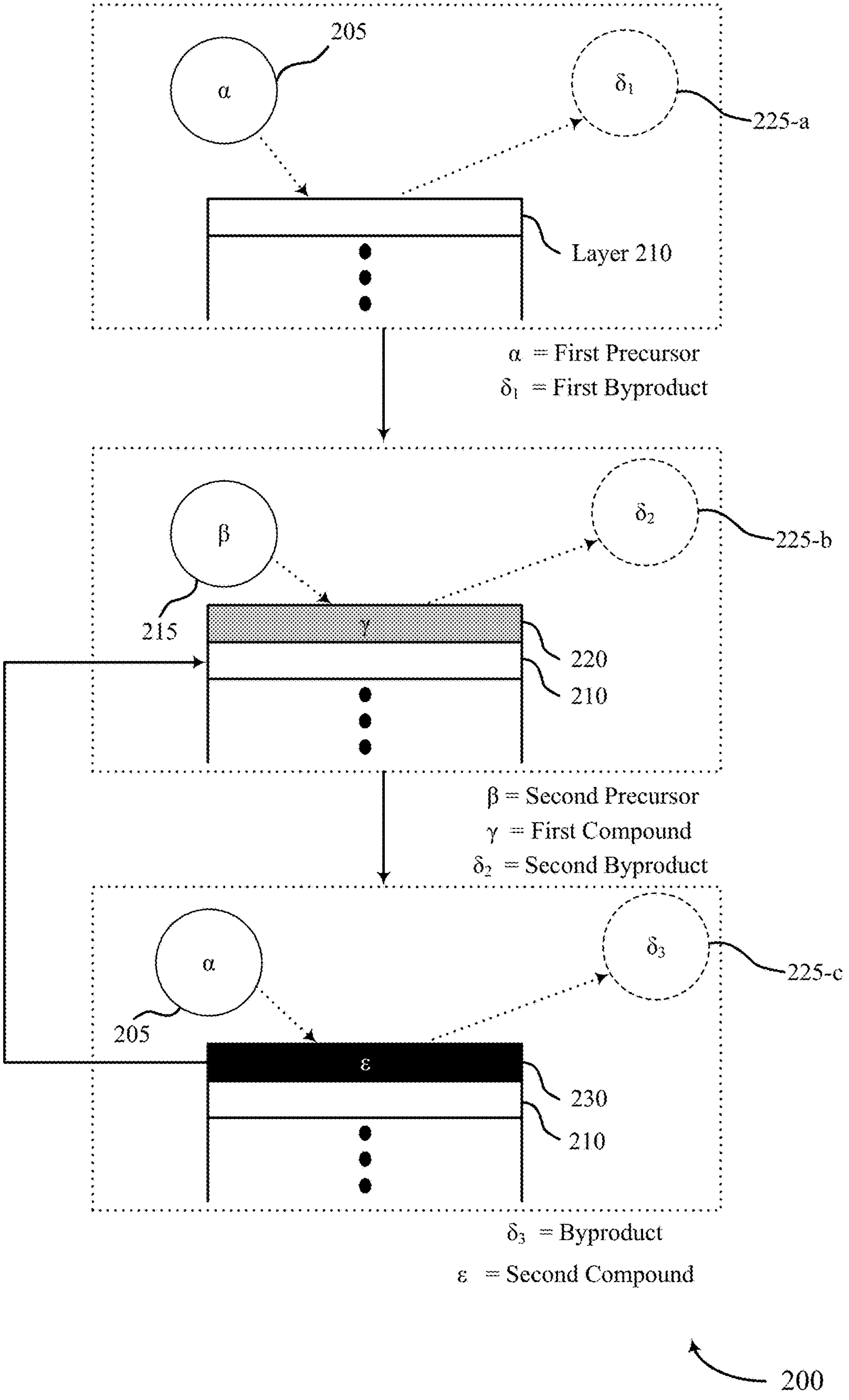
FIG. 2 shows an example of a material formation process that supports methods for depositing germanium films by atomic layer deposition in accordance with examples as disclosed herein.

FIG. 2 illustrates an example of a material deposition process 200 that supports methods for depositing germanium films by atomic layer deposition in accordance with examples as disclosed herein.

As illustrated in FIG. 2, a layer 210 may be exposed to a first precursor 205. The first precursor, for instance, include a germanium amidinate. For instance, the first precursor 205 may have the chemical formula $Ge(AMD)_2$ or X—Ge (AMD), where Ge corresponds to Germanium, AMD corresponds to amidinate, and where X may include a dialkylamide, an alkoxide, an alkylsulfide, an alkylselenide, an alkyltelluride, an amide including two substituents, a hydrazide including three substituents, a cyanide, an isocyanide, a cyanate, an isocyanate, a selenocyanate, an isoselenocyanate, a tellurocyanate, an isotellurocyanate, an azide, a fulminate, an isofulminate, a halide, or any combination thereof, wherein the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituent.

In some examples, the first precursor 205 reacting with the layer 210 may form a byproduct 225-*a*, which may be removed from the reactor. After forming the first compound 220, the first compound 220 may be exposed to a second precursor 215. The second precursor 215 may react with the first compound 220 to form second compound 230. In some examples, the second precursor 215 may form a layer on the first compound 220 and the layer may react with the first compound 220 to form the second compound 230. In other examples, the second precursor 215 may directly react with the first compound 220 to form the second compound 230. This reaction may produce a byproduct 225-*b*, which may be removed from the reactor. In some examples, the first compound may be a germanium compound that includes germanium and at least one leaving group.

In some examples, the second compound 230 may be exposed to a first precursor 205 to form a second instance of the first compound on the second compound 230. In some examples, the first precursor may form a layer on the second compound 230 and the layer may react with the second compound 230 to form the second instance of the first compound. In other examples, the first precursor 205 may directly react with the second compound 230 to form the second instance of the first compound. This reaction may produce a byproduct 225-*c*, which may be removed from the reactor. Without deviating from the scope of the disclosure, the second instance of the first compound may instead be a third compound distinct from the first compound. In some examples, the process may be repeated to deposit multiple layers of the second compound 230. For instance the process may repeat again where the second instance of the first compound acts as depicted first compound 220 and second compound 230 acts as layer 210. In some examples, first precursor 205 and second precursor 215 may be delivered to the reactor (e.g., or reactors) using an inert gas (e.g., argon, helium, nitrogen). Additionally or alternatively, the byproducts 225-*a*, 225-*b*, and/or 225-*c* may be purged using an inert gas (e.g., argon, helium, nitrogen). In some examples, reacting the second precursor with the first compound may remove the at least one leaving group from the germanium compound (e.g., via byproduct 225-*b*). In some examples, exposing the layer 210 to the first precursor 205 reacting the second precursor 215 with the first compound 220, performing the exposure to the first precursor 205 to form a second instance of instance of the first compound on the second compound 230, or any combination thereof may be performed at a temperature below 300 degrees Celsius, below 250 degrees Celsius, below 150 degrees Celsius, or any combination thereof.

In some examples, the first precursor 205 may have the chemical formula $Ge(AMD)_2$, where Ge corresponds to germanium and AMD corresponds do amidinate. In some such examples, the first precursor may have the following formula:

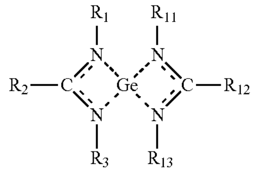

In such examples, $R_1$, $R_3$, $R_{11}$, and $R_{13}$ may each include at least one of methyl, ethyl, propyl, butyl, iso-propyl, linear alkyl, branched alkyl, aryl, or hexyl alkyl, where $R_2$ and $R_{12}$ each include at least one of hydrogen, methyl, ethyl, propyl, butyl, iso-propyl, linear alkyl, branched alkyl, aryl, hexyl alkyl, octyl alkyl, or a dialkylamino, where C corresponds to carbon, and where N corresponds to nitrogen. In some such examples, $R_1$ and $R_{11}$ are associated with a same compound or a same element, $R_3$ and $R_{13}$ are associated with a same compound or a same element, $R_2$ and $R_{12}$ are associated with a same compound or a same element, or any combination thereof. Additionally or alternatively, in some such examples, dialkylamino may include a dimethylamino, a diethylamino, a methylethylamino, or a dialkylamido.

Alternatively, the first precursor 205 may have a chemical formula given as X—Ge(AMD), where Ge corresponds to germanium, AMD corresponds do amidinate, and X includes an alkoxide, an alkylsulfide, an alkylselenide, an alkyltelluride, an amide including two substituents, a hydrazide comprising three substituents, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, a halide, or any combination thereof. In some such examples, the first precursor may have the following chemical formula:

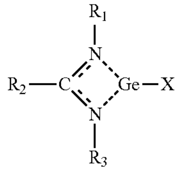

where $R_1$ and $R_3$ each include at least one of methyl, ethyl, propyl, butyl, secondary butyl, tertiary butyl, iso-propyl, linear alkyl, branched alkyl, or hexyl alkyl, where $R_2$ includes at least one of hydrogen, deuterium, methyl, ethyl, propyl, butyl, secondary butyl, tertiary butyl, iso-propyl, linear alkyl, branched alkyl, hexyl alkyl, octyl alkyl, where C corresponds to carbon, and where N corresponds to nitrogen.

In some examples, the second precursor 215 may include ammonia or an alcohol. Additionally or alternatively, the second precursor 215 may have the chemical formula YH, where H may be a hydrogen, and Y may be an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide, where the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents. Additionally or alternatively, the second precursor 215 may have the chemical formula Y—$ZR_1R_2R_3$, where Y may be an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide, where the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents. In some examples, Z may be independently selected from silicon, germanium, or tin. In some examples, each of $R_1$, $R_2$, and $R_3$ may be independently selected from hydrogen, deuterium, an alkyl group, an aryl group, a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or a moiety including carbon atoms, silicon atoms, germanium atoms, or tin atoms, or any combination thereof. In some examples, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may either be to other (carbon, silicon, germanium, or tin) atoms of the set or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic, in some examples, $R_a$ through $R_x$ may be independently selected from hydrogen (or deuterium), an alkyl group, or an aryl group.

In some examples, the term ‘alkyl’ may refer to a saturated hydrocarbon chain, an unsaturated hydrocarbon chain, a linear hydrocarbon chain, a branched hydrocarbon chain, or a cyclic hydrocarbon chain including from one carbon atom (e.g., $C_1$) to ten carbon atoms (e.g., $C_{10}$).

In some examples, a “methyl” may refer to a compound with the chemical formula $CH_3$, where “C” may refer to carbon and “H” may refer to hydrogen. In some examples, an “ethyl” may refer to a compound with the chemical formula $CH_2CH_3$. In some examples, a “propyl” may refer to a compound with the chemical formula $CH_2CH_2CH_3$. In some examples, an “isopropyl” may refer to a compound with the chemical formula $CH_3CHOHCH_3$. In some examples, an alkyl group may refer to a compound with a chemical formula $C_nH_{2n+1}$, where n is an integer greater than or equal to 1. In some examples, a sulfide may refer to an inorganic anion of sulfur, a selenide may refer to an inorganic anion of selenium, and a telluride may refer to an inorganic anion of tellurium. In some examples, a dialkylamide may refer to an amide group with two alkyl groups.

A dimethylamino is the moiety with chemical formula $(CH_3)_2N$—, where “C” may refer to carbon, “H” may refer to hydrogen (or deuterium), and “N” may refer to nitrogen. In some examples, a diethylamino is the moiety with chemical formula $(CH_2CH_3)_2N$—. In some examples, ethylmethylamino is the moiety with chemical formula $CH_2CH_3(CH_3)N$—.

In some examples, the methods or aspects of the methods described herein may be performed using chemical vapor deposition (CVD). For instance, the first precursor 205 may be deposited using CVD and the second precursor may react with the first compound 220 via the methods described herein, the first compound 220 may be formed with the first precursor 205 via the methods described herein and the second precursor 215 may be deposited onto the first compound 220 using CVD, or the first precursor 205 and the second precursor 215 may both be deposited using CVD.

Independently including or selecting from a set of elements and/or compounds may refer to a capability that a first element or compound may be substituted for another while still producing a precursor usable for forming a compound on a surface of a material.

It should be noted that there may be examples in which the second precursor 215 may react with the layer 210 to form a third compound. In some such examples, the first precursor 205 may react with the third compound to form a fourth compound. The process may be repeated and such that multiple layers of a germanium-based film may form.

While the second compound 230 may be formed by sequentially introducing and reacting the first precursor 205 and the second precursor 215 (e.g., in an ABAB . . . sequence), the precursors may be introduced in a different order than that described above (e.g., in a BABA . . . sequence, an AABAAB . . . sequence, an ABBABB sequence) depending on the composition of the second compound 230. For instance, first precursor 205 may be introduced followed by the introduction of the second precursor 215. Depending on the composition of the second compound 230, more than one introduction (e.g., pulse) of the first precursor 205 or the second precursor 215 may be conducted before the second precursor 215 or the first precursor 205, respectively, are introduced.

In some examples, a first molecule for the first precursor 205 (e.g., precursor 1-a) and a second molecule for the second precursor 215 (e.g., precursor 2-a) may be introduced repeatedly for one or more cycles (e.g., AA times or AA cycles, where AA is some positive integer). After repeatedly introducing precursor 1-a and precursor 2-a over the multiple cycles, a third molecule for the first precursor 205 (e.g., precursor 1-b) and a fourth molecule for the second precursor (i.e., precursor 2-b) may be introduced repeatedly for one or more cycles (e.g., BB times or BB cycles, where BB is some positive integer). This process may continue for multiple other precursors up to a predefined amount (e.g., CC times or CC cycles for precursors 1-c and 2-c, DD times or DD cycles for precursors 1-d and 2-d, and so on, up to XX times or XX cycles for precursors 1-x and 2-x, where CC, DD, and XX may each be a positive integer). After this process continues up to the predefined amount, the process may repeat (e.g., precursors 1-a and 2-a may be used again for AA times or AA cycles). It should be noted that each of the molecules used as precursors for each cycle may be selected from the same molecule relative to a different cycle or different molecules from the molecules described herein for first precursor 205 and second precursor 215. In some examples, ALD cycles may include alternating pulses of a germanium amidinate and a reagent capable of giving protons or trimethylsilyl groups.

In some such examples, a third precursor may be reacted with a layer of second compound 230 to form another compound on the layer of second compound 230. Additionally, a fourth, precursor may be reacted with the other compound to form a second layer of on the layer of second compound 230. In some such examples, a set of X precursor pairs may be identified, where each precursor pair of the set of X precursor pairs includes one of a first set of precursors and one of a second set of precursors, where each precursor pair has an associated quantity of cycles, where X is an integer greater than or equal to 2, where each precursor of the first set of precursors has the form $Ge(AMD)_2$ or X—Ge(AMD), where Ge corresponds to germanium, AMD corresponds to amidinate, and where X may include a dialkylamide, an alkoxide, an alkylsulfide, an alkylselenide, an alkyltelluride, an amide including two substituents, a hydrazide including three substituents, a cyanide, an isocyanide, a cyanate, an isocyanate, a selenocyanate, an isoselenocyanate, a tellurocyanate, an isotellurocyanate, an azide, a fulminate, an isofulminate, a halide, or any combination thereof, wherein the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituent. Additionally, according to the associated quantity of cycles for each precursor pair of the set of X precursor pairs and to form a respective film associated with the precursor pair, a reacting of the one of the first set of precursors to form a respective compound and a reacting of the one of the second set of precursors with the respective compound to form one or more layers of may be performed.

The methods described herein may have one or more advantages. For instance, using a germanium amidinate in the first precursor 205 may enable reactions (e.g., the formation of first compound 220 and/or the formation of second compound 230) to occur at lower temperatures as compared to precursors that do not include the germanium amidinate (e.g., below 300 degrees Celsius, below 250 degrees Celsius, below 150 degrees Celsius). Additionally or alternatively, using germanium amidinate in the first precursor 205 may enable deposition that occurs more quickly for a given temperature as compared to precursors that do not include germanium amidinate.

Figure 3:
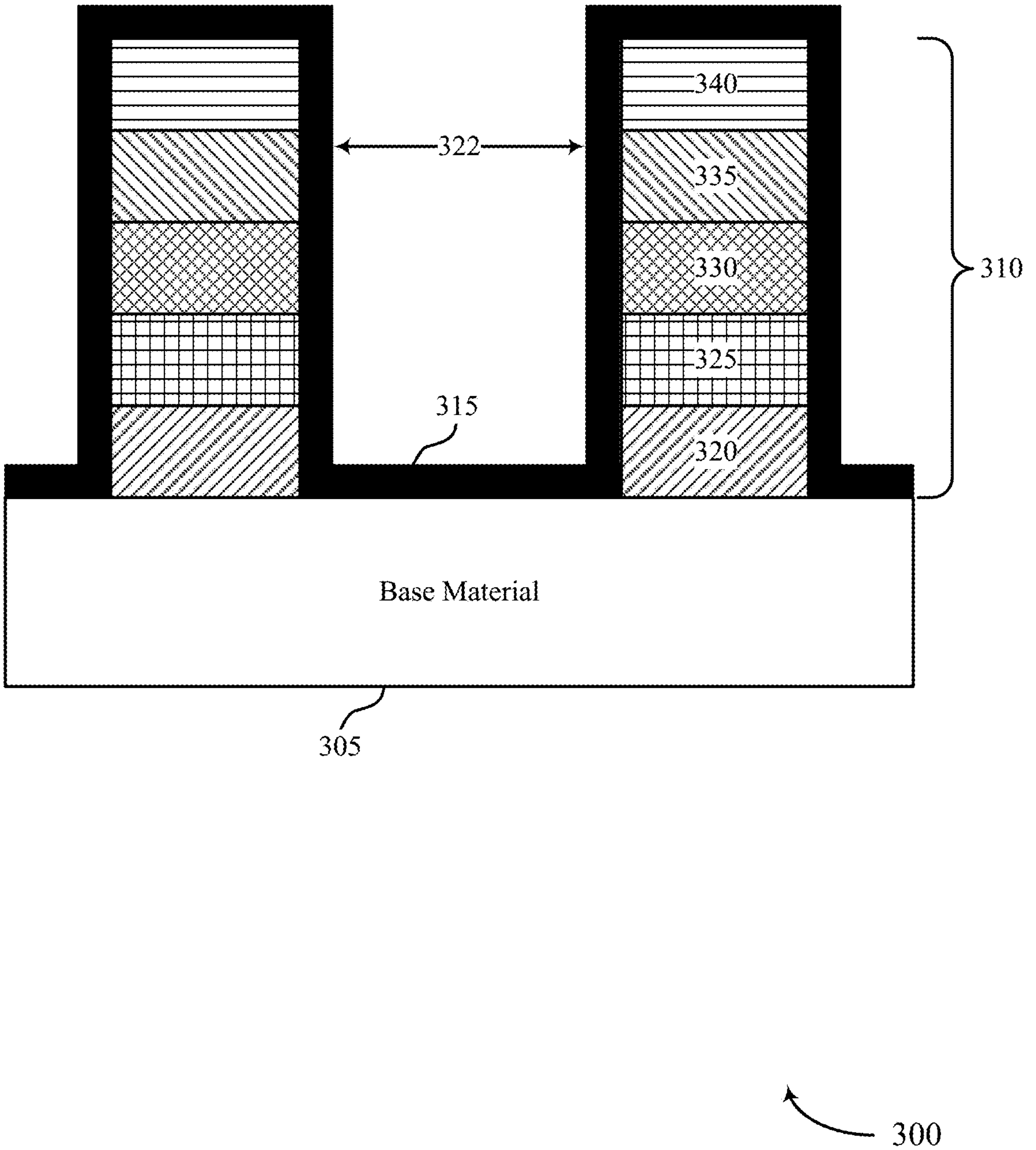
FIG. 3 shows an example of an electronic device that supports methods for depositing germanium films by atomic layer deposition in accordance with examples as disclosed herein.

FIG. 3 shows an example of an electronic device 300 that supports methods for depositing germanium films by atomic layer deposition in accordance with examples as disclosed herein. The electronic device 300 may include a base material 305 with one or more features 310 (e.g., pillars, stacks), where the base material 305 and the one or more features 310 may be covered in a material 315. Each feature 310 may include materials 320, 325, 330, 335, and 340, where each of material 320, 325, 330, 335, and 340 may be an example of a chalcogenide material, an organic (e.g., carbon) material, a carbon allotrope (e.g., graphite), a reactive metal (e.g., tungsten, aluminum, or tantalum), a thermally-sensitive material, an oxidation-sensitive material, or any combination thereof. Some of material 320, 325, 330, 335, and 340 may be examples of other materials. In some examples, base material 305 or the combination of base material 305 and one or more features 310 may be an example of a base material 105 as described with reference to FIG. 1 or a layer 210 as described with reference to FIG. 2. Additionally or alternatively, material 315 may be an example of a second compound 125 as described with reference to FIG. 1 or a second compound 20 as described with reference to FIG. 2.

While FIG. 3 illustrates feature 310 including five materials, each feature may be made up of a single material or two or more materials. The features may be separated from each other by openings 322. The materials of the features 310 may be formed adjacent to (e.g., over) the base material 305 using techniques such as photolithography, physical vapor deposition (PVD), chemical vapor deposition (CVD), or ALD. In some examples, the base material 305 may include one or more materials, layers, structures, or regions thereon. The features 310 may be considered high aspect ratio (HAR) features, where HAR may for instance correspond to greater than or equal to an aspect ratio of 10:1, greater than or equal to an aspect ratio of 20:1, greater than or equal to an aspect ratio of 25:1, or greater than or equal to an aspect ratio of 50:1. In some examples, the material 315 may be formed on one of but not both base material 305 and the one or more features 310. Additionally or alternatively, the material 315 may be formed as a material within each of the one or more features 310. Additionally or alternatively, the material 315 may be formed on a planar material or on low aspect ratio features of an electronic device.

The material 315 may be formed over the features 310 according to the aspects described herein. For instance, the material 315 may be formed by sequentially exposing the features 310 of the electronic device 300 to a first precursor (e.g., first precursor 205) and a second precursor (e.g., second precursor 215) as described herein. The material 315 may function as a conductive component of electronic device 300, such as a transistor, a capacitor, an electrode, an etch-stop material, a gate, a barrier material, or a spacer material. One or more materials and/or structure, such as a gate, may subsequently be formed in the openings 322 by techniques such as photolithography, PVD, CVD, or ALD and/or additional process acts conducted to form a complete electronic device containing electronic device 300.

The material 315 may be conformally formed on the features 310 according to the aspects described herein. For instance, the thickness of material 315 on sidewalls of the features 310 may be substantially uniform. For instance, the material 315 may be formed to a thickness ranging from a monolayer to 100 nm. Alternatively, the material 315 may be formed at a greater thickness. The material 315 may be in direct contact with each material of the features 310 or some materials of the features 310. Additionally or alternatively, the material 315 may be in contact with the base material 305.

In some examples, the base material 305 may be a structure on a substrate (e.g., a wafer). In some such examples, the base material 305 may span in a first direction and a second direction, where the first direction is orthogonal to the second direction. Additionally, a memory device including the base material 305 may include word lines extending along the first direction and/or the second direction and bit lines extending along a third direction orthogonal to the first direction and the second direction. In some such examples, a stack of materials (e.g., a sequence of materials, such as features 310) may be formed in one or more recesses of the word lines, where the stack may extend along the first direction and/or the second direction and where the sequence of materials may include a memory cell (e.g., a chalcogenide element). In some examples, the stacks may each be coupled with one word line and one bit line. In some examples, the techniques described herein may be used to form layers of germanium on the base material 305, the word lines, the bit lines, the stacks, or any combination thereof.

Figure 4:
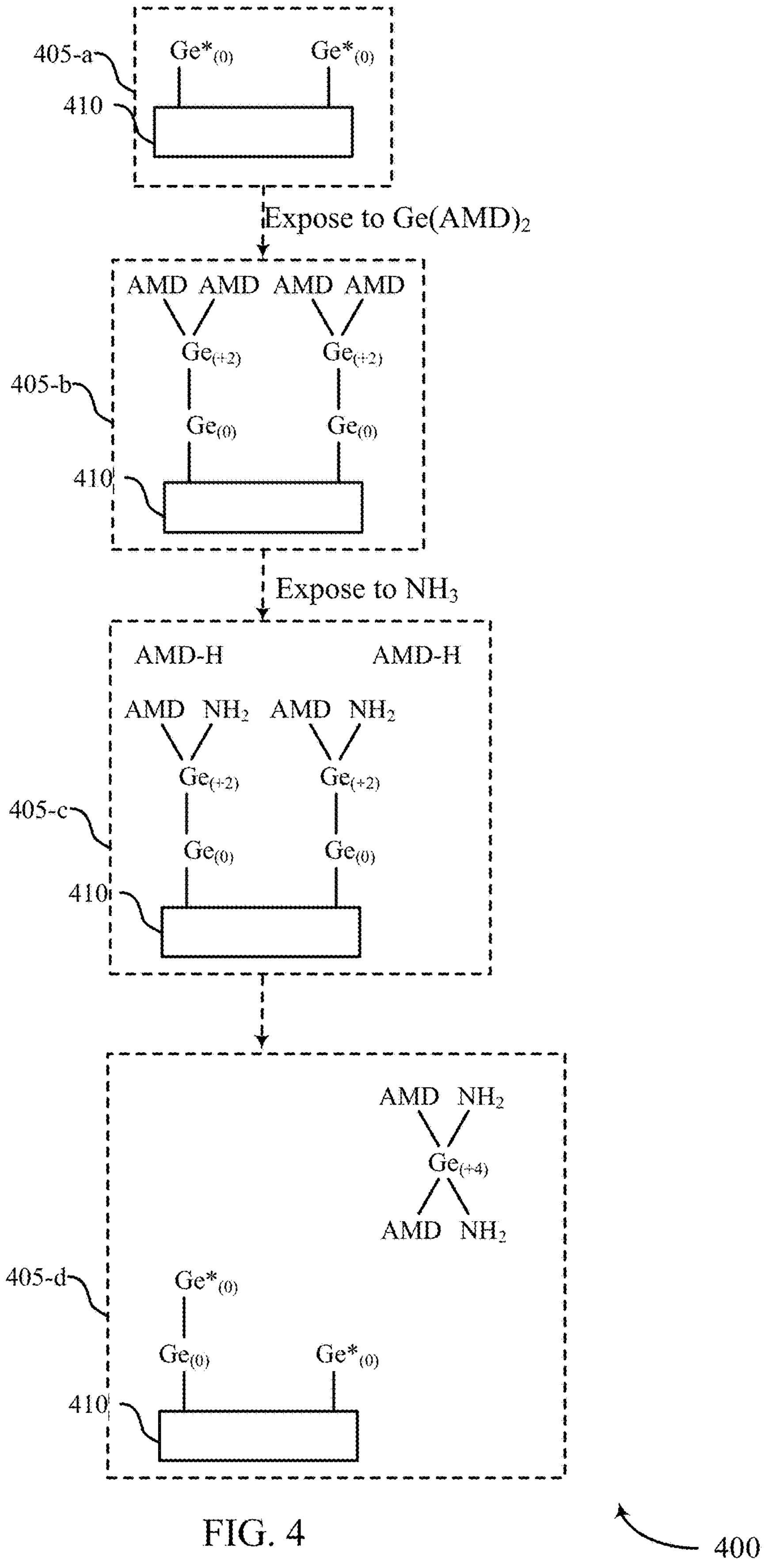
FIG. 4 shows an example of a material formation mechanism that supports methods for depositing germanium films by atomic layer deposition in accordance with examples as disclosed herein.

FIG. 4 shows an example of a material deposition mechanism 400 that supports methods for depositing germanium films by atomic layer deposition in accordance with examples as disclosed herein.

As illustrated in stage 405-*a*, a base material 410 may initially include a layer of germanium (e.g., unionized germanium). In between stages 405-*a* and 405-*b*, the base material 410 may be exposed to a germanium amidinate (e.g., $Ge(AMD)_2$). For instance, the base material 410 may be located in a reactor (e.g., deposition chamber) within which a gaseous phase of the germanium amidinate may be introduced. Exposing the initial layer of germanium to the germanium amidinate may enable the initial layer of germanium to bond with a second layer of germanium, where each germanium atom of the second layer of germanium is bonded with a quantity of amidinate (e.g., two amidinate molecules each). In some examples, each germanium atom of the second layer of germanium may be ionized (e.g., may have a positive charge of 2).

In between stages 405-*b* and 405-*c*, the second layer of germanium may be exposed to ammonia (e.g., $NH_3$). For instance, the reactor in which the base material 410 is located may have ammonia introduced. Exposing the second layer of germanium to the ammonia may enable part of the ammonia molecules (e.g., an $NH_2$) to bond with germanium atoms of the second layer of germanium. In some cases, the part of the ammonia molecules that bond with the germanium atoms may replace one or more of the amidinates, which may be released as a byproduct in the form of AMD-H. In between stages 405-*c* and 405-*d*, the AMD-H byproduct may be purged (e.g., removed from the reactor) before proceeding to stage 405-*d*.

At stage 405-*d*, a first subset of the second layer of germanium atoms may react with the amidinate and the $NH_2$ to form a byproduct that includes an ionized germanium atom (e.g., with a positive 4 charge) bonded with two molecules of amidinate and two molecules of $NH_2$. A second subset of the second layer of germanium atoms may remain bonded with the initial layer of germanium and may be unionized after this reaction occurs. The byproduct may be purged from (e.g., removed from the reactor). In some examples, the temperature of the reactor may be set or adjusted such that the byproduct including the ionized germanium atom bonded with two molecules of amidinate and two molecules of $NH_2$ forms. In some examples, the germanium amidinate and/or the $NH_3$ may be delivered to the reactor (e.g., or reactors) using an inert gas (e.g., argon, helium, nitrogen). Additionally or alternatively, the byproducts (e.g., the AMD-H or the ionized germanium atom bonded with two molecules of amidinate and two molecules of $NH_2$) may be purged using an inert gas (e.g., argon, helium, nitrogen).

In some examples, the process may be repeated to deposit multiple layers of a germanium film. For instance, after depositing the second subset of the second layer of germanium atoms, the second subset of the second layer of germanium atoms and any exposed portions of the initial layer of germanium atoms may be exposed to germanium amidinate followed by ammonia.

In a first example, the chemical formula for the material deposition mechanism 400 may have the following form: $Ge(AMD)_2+Ge(AMD)_2+2NH_3 \rightarrow Ge+2H\text{-}AMD+Ge(NH_2)_2(AMD)_2$. It should be noted that the other chemical formulas for the material deposition mechanism 400 may be used. In a second example, the chemical formula may have the following form: $Ge(AMD)_2+Ge(AMD)_2+4NH_3 \rightarrow Ge+4H\text{-}AMD+Ge(NH_2)_4$. In a third example (e.g., an example in which ammonia is not used in the material deposition mechanism 400), the chemical formula may have the following form: $Ge(AMD)_2+Ge(AMD)_2 \rightarrow Ge+Ge(AMD)_4$. In a fourth example, the chemical formula may have the following form: $3Ge(AMD)_2+2NH_3 \rightarrow 3Ge+6H\text{-}AMD+N_2$. In a fifth example, the chemical formula may have the following form: $Ge(AMD)_2+2NH_3 \rightarrow Ge+2H\text{-}AMD+H_2N—NH_2$. In a sixth example (e.g., an example in which ammonia is not used in the material deposition mechanism 400), the chemical formula may have the following form: $Ge(AMD)_2 \rightarrow Ge+AMD\text{-}AMD$. The first, second, and third examples may be examples of balanced disproportionation and the fourth, fifth, and sixth examples may be examples of redox reactions.

The methods described herein may have one or more advantages. For instance, the techniques described herein may enable the germanium atoms of the second subset of the second layer of germanium atoms to be unionized after performing the material deposition mechanism 400. The germanium atoms being unionized may enable the same procedure to be performed again for depositing additional germanium atoms. Additionally, the method described herein may enable multiple parts of deposition to occur in one chamber. For instance, layers of a first material may be deposited in a chamber and then layers of germanium may be deposited in the same chamber.

Figure 5:
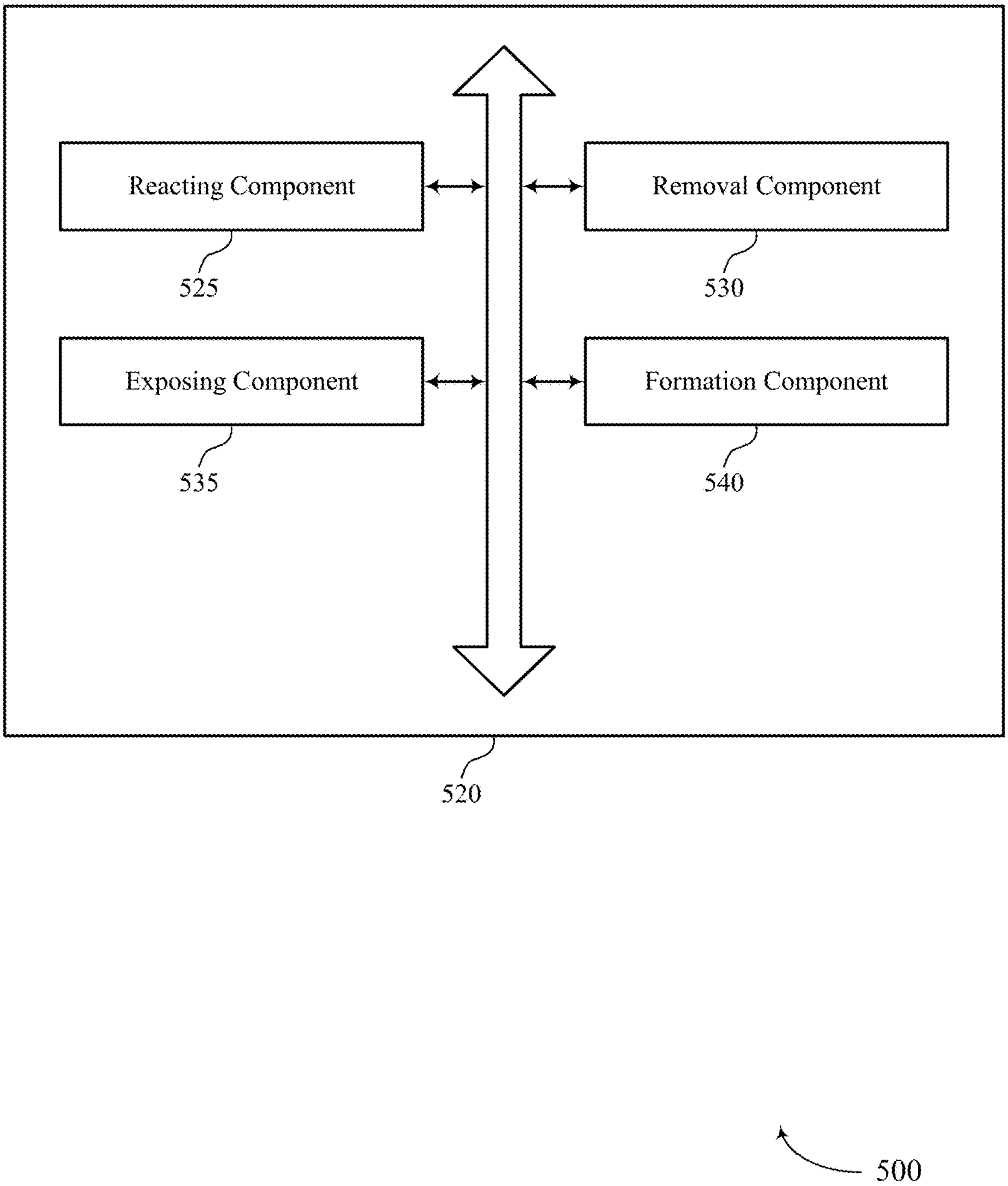
FIG. 5 shows a block diagram of a controller that supports methods for depositing germanium films by atomic layer deposition in accordance with examples as disclosed herein.

FIG. 5 shows a block diagram 500 of a controller 520 that supports methods for depositing germanium films by atomic layer deposition in accordance with examples as disclosed herein. The controller 520 may be an example of aspects of a controller as described with reference to FIGS. 1 through 4. The controller 520, or various components thereof, may be an example of means for performing various aspects of methods for depositing germanium films by atomic layer deposition as described herein. For example, the controller 520 may include a reacting component 525, a removal component 530, an exposing component 535, a formation component 540, or any combination thereof. Each of these components may communicate, directly or indirectly, with one another (e.g., via one or more buses).

The reacting component 525 may be configured as or otherwise support a means for reacting a first precursor with a base material to form a germanium compound on the base material, where the germanium compound includes germanium and at least one leaving group. In some examples, the reacting component 525 may be configured as or otherwise support a means for reacting a second precursor with the germanium compound at a temperature below 300 degrees Celsius. The removal component 530 may be configured as or otherwise support a means for removing the at least one leaving group from the germanium compound based at least in part on reacting the second precursor with the germanium compound.

In some examples, the first precursor includes the chemical formula:

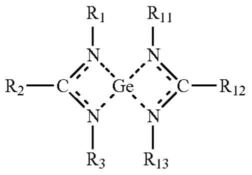

In some such examples, $R_1$, $R_3$, $R_{11}$, and $R_{13}$ each include at least one of methyl, ethyl, propyl, butyl, secondary butyl, tertiary butyl, iso-propyl, linear alkyl, branched alkyl, or hexyl alkyl. In some examples, $R_2$ and $R_{12}$ each include at least one of hydrogen, deuterium, methyl, ethyl, propyl, butyl, secondary butyl, tertiary butyl, iso-propyl, linear alkyl, branched alkyl, hexyl alkyl, octyl alkyl, or a dialkylamino. In some examples, C corresponds to carbon. In some examples, N corresponds to nitrogen.

In some examples, dialkylamino includes a dimethylamino, a diethylamino, or a methylethylamino.

In some examples, each of $R_1$, $R_3$, $R_{11}$, and $R_{13}$ are ethyl. In some examples, each of $R_2$ and $R_{12}$ are hydrogen.

In some examples, each of $R_1$, $R_3$, $R_{11}$, and $R_{13}$ are ethyl. In some examples, each of $R_2$ and $R_{12}$ are methyl.

In some examples, the first precursor includes the chemical formula X—Ge(AMD). In some examples, Ge corresponds to germanium. In some examples, AMD corresponds to amidinate. In some examples, X includes an alkoxide, an alkylsulfide, an alkylselenide, an alkyltelluride, an amide including two substituents, a hydrazide including three substituents, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, a halide, or any combination thereof. In some examples, the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

In some examples, the first precursor may include the chemical formula:

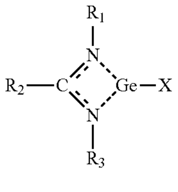

In some such examples, $R_1$ and $R_3$ each include at least one of methyl, ethyl, propyl, butyl, secondary butyl, tertiary butyl, iso-propyl, linear alkyl, branched alkyl, or hexyl alkyl, where $R_2$ include at least one of hydrogen, deuterium, methyl, ethyl, propyl, butyl, secondary butyl, tertiary butyl, iso-propyl, linear alkyl, branched alkyl, hexyl alkyl, octyl alkyl, where C corresponds to carbon, and where N corresponds to nitrogen.

In some examples, the second precursor has the chemical formula YH. In some examples, H is a hydrogen. In some examples, Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide. In some examples, the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

In some examples, the second precursor has the chemical formula $Y—ZR_1R_2R_3$. In some examples, Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide. In some examples, the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents. In some examples, Z is independently selected from silicon, germanium, or tin. In some examples, each of $R_1$, $R_2$, and $R_3$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, a $—SiR_aR_bGeR_cR_dR_e$ moiety, or a moiety including carbon atoms, silicon atoms, germanium atoms, or tin atoms, or any combination thereof. In some examples, each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof. In some examples, up to 10 atoms of the carbon atoms, silicon atoms, germanium atoms, tin atoms, or any combination thereof are distinct from any carbon atoms, silicon atoms, germanium atoms, or tin atoms of $R_a$ through $R_x$. In some examples, $R_a$ through $R_x$ are independently selected from hydrogen, deuterium, an alkyl group, or an aryl group. In some examples, x of $R_x$ is an index distinct from a of $R_a$.

In some examples, the reacting occurs at a temperature below 250 degrees Celsius.

In some examples, the reacting occurs at a temperature below 150 degrees Celsius.

The exposing component 535 may be configured as or otherwise support a means for exposing a base material to a first precursor to form a germanium compound on the base material, where the first precursor includes germanium bis (trimethylsilyl)amide or a germanium bis(amide) having the chemical formula $(R_1R_2R_3Z_1)(R_4R_5R_6Z_2)N—Ge—N(Z_3R_7R_8R_9)(Z_4R_{10}R_{11}R_{12})$, where $Z_1$, $Z_2$, $Z_3$, and $Z_4$ are independently selected from germanium, tin, or silicon, and where $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, a $—SiR_aR_bGER_cR_dR_e$ moiety, or a moiety including carbon atoms, silicon atoms, germanium atoms, or tin atoms, or any combination thereof, where each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof, where up to 6 atoms of the carbon atoms, silicon atoms, germanium atoms, tin atoms, or any combination thereof are distinct from any carbon atoms, silicon atoms, germanium atoms, or tin atoms of $R_a$ through $R_x$, where $R_a$ through $R_x$ are independently selected from hydrogen, deuterium, an alkyl group, or an aryl group, and where x of $R_x$ is an index distinct from a of $R_a$. In some examples, the reacting component 525 may be configured as or otherwise support a means for reacting a second precursor with the germanium compound. The formation component 540 may be configured as or otherwise support a means for forming a layer of germanium on the base material based at least in part on exposing the base material to the first precursor and reacting the second precursor with the germanium compound.

In some examples, the second precursor has the chemical formula YH. In some examples, H is a hydrogen. In some examples, Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide. In some examples, the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

In some examples, the second precursor has the chemical formula $Y—ZR_1R_2R_3$. In some examples, Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide. In some examples, the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents. In some examples, Z is independently selected from silicon, germanium, or tin. In some examples, each of $R_1$, $R_2$, and $R_3$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, or a moiety including carbon atoms, silicon atoms, germanium atoms, or tin atoms, or any combination thereof. In some examples, each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof. In some examples, up to 10 atoms of the carbon atoms, silicon atoms, germanium atoms, tin atoms, or any combination thereof are distinct from any carbon atoms, silicon atoms, germanium atoms, or tin atoms of $R_a$ through $R_x$. In some examples, $R_a$ through $R_x$ are independently selected from hydrogen, deuterium, an alkyl group, or an aryl group. In some examples, x of $R_x$ is an index distinct from a of $R_a$.

In some examples, the formation component 540 may be configured as or otherwise support a means for forming a plurality of stacks of materials on a substrate. In some examples, the exposing component 535 may be configured as or otherwise support a means for exposing the plurality of stacks of materials to a first precursor to form a germanium compound on the plurality of stacks of materials, where the germanium compound includes a germanium and at least one leaving group. In some examples, the exposing component 535 may be configured as or otherwise support a means for exposing the plurality of stacks of materials to a second precursor at a temperature below 300 degrees Celsius. In some examples, the formation component 540 may be configured as or otherwise support a means for forming a layer of germanium on the plurality of stacks of materials based at least in part on exposing the plurality of stacks of materials to the first precursor and reacting the second precursor with the germanium compound at the temperature below 300 degrees Celsius.

In some examples, the first precursor includes the chemical formula:

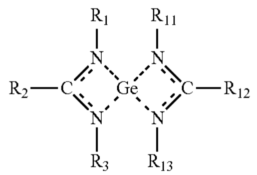

In some such examples, $R_1$, $R_3$, $R_{11}$, and $R_{13}$ each include at least one of methyl, ethyl, propyl, butyl, secondary butyl, tertiary butyl, iso-propyl, linear alkyl, branched alkyl, or hexyl alkyl. In some examples, $R_2$ and $R_{12}$ each include at least one of hydrogen, deuterium, methyl, ethyl, propyl, butyl, secondary butyl, tertiary butyl, iso-propyl, linear alkyl, branched alkyl, hexyl alkyl, octyl alkyl, or a dialkylamino. In some examples, C corresponds to carbon. In some examples, N corresponds to nitrogen.

In some examples, dialkylamino includes a dimethylamino, a diethylamino, or a methylethylamino.

In some examples, each of $R_1$, $R_3$, $R_{11}$, and $R_{13}$ are ethyl. In some examples, each of $R_2$ and $R_{12}$ are hydrogen.

In some examples, each of $R_1$, $R_3$, $R_{11}$, and $R_{13}$ are ethyl. In some examples, each of $R_2$ and $R_{12}$ are methyl.

In some examples, the first precursor includes the chemical formula X—Ge(AMD). In some examples, Ge corresponds to germanium. In some examples, AMD corresponds to amidinate. In some examples, X includes an alkoxide, an alkylsulfide, an alkylselenide, an alkyltelluride, an amide including two substituents, a hydrazide including three substituents, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, a halide, or any combination thereof. In some examples, the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

In some examples, the first precursor includes the chemical formula:

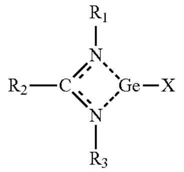

In some such examples, $R_1$ and $R_3$ each include at least one of methyl, ethyl, propyl, butyl, secondary butyl, tertiary butyl, iso-propyl, linear alkyl, branched alkyl, or hexyl alkyl, where $R_2$ include at least one of hydrogen, deuterium, methyl, ethyl, propyl, butyl, secondary butyl, tertiary butyl, iso-propyl, linear alkyl, branched alkyl, hexyl alkyl, octyl alkyl, where C corresponds to carbon, and where N corresponds to nitrogen.

In some examples, the second precursor has the chemical formula YH. In some examples, H is a hydrogen. In some examples, Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide. In some examples, the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

In some examples, the second precursor has the chemical formula $Y—ZR_1R_2R_3$. In some examples, Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide. In some examples, the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents. In some examples, Z is independently selected from silicon, germanium, or tin. In some examples, each of $R_1$, $R_2$, and $R_3$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, or a moiety including carbon atoms, silicon atoms, germanium atoms, or tin atoms, or any combination thereof. In some examples, each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof. In some examples, up to 10 atoms of the carbon atoms, silicon atoms, germanium atoms, tin atoms, or any combination thereof are distinct from any carbon atoms, silicon atoms, germanium atoms, or tin atoms of $R_a$ through $R_x$. In some examples, $R_a$ through $R_x$ are independently selected from hydrogen, deuterium, an alkyl group, or an aryl group. In some examples, x of $R_x$ is an index distinct from a of $R_a$.

In some examples, the reacting occurs at a temperature below 250 degrees Celsius.

In some examples, the reacting occurs at a temperature below 150 degrees Celsius.

Figure 6:
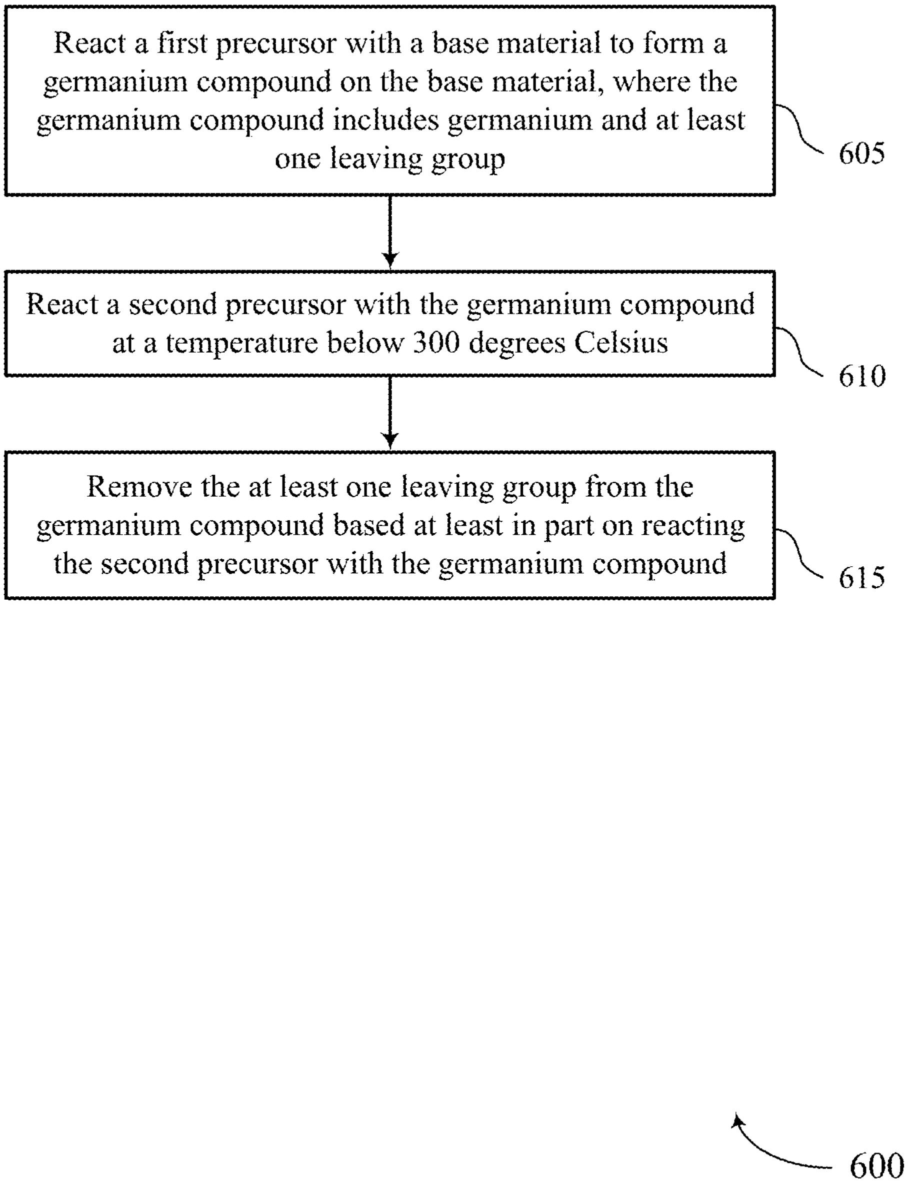
FIGS. 6 through 8 show flowcharts illustrating a method or methods that support methods for depositing germanium films by atomic layer deposition in accordance with examples as disclosed herein.

FIG. 6 shows a flowchart illustrating a method 600 that supports methods for depositing germanium films by atomic layer deposition in accordance with examples as disclosed herein. The operations of method 600 may be implemented by a controller or its components as described herein. For example, the operations of method 600 may be performed by a controller as described with reference to FIGS. 1 through 5. In some examples, a controller may execute a set of instructions to control the functional elements of the device to perform the described functions. Additionally, or alternatively, the wireless controller may perform aspects of the described functions using special-purpose hardware.

At 605, the method may include reacting a first precursor with a base material to form a germanium compound on the base material, where the germanium compound includes germanium and at least one leaving group. The operations of 605 may be performed in accordance with examples as disclosed herein. In some examples, aspects of the operations of 605 may be performed by a reacting component 525 as described with reference to FIG. 5.

At 610, the method may include reacting a second precursor with the germanium compound at a temperature below 300 degrees Celsius. The operations of 610 may be performed in accordance with examples as disclosed herein. In some examples, aspects of the operations of 610 may be performed by a reacting component 525 as described with reference to FIG. 5.

At 615, the method may include removing the at least one leaving group from the germanium compound based at least in part on reacting the second precursor with the germanium compound. The operations of 615 may be performed in accordance with examples as disclosed herein. In some examples, aspects of the operations of 615 may be performed by a removal component 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for reacting a first precursor with a base material to form a germanium compound on the base material, where the germanium compound includes germanium and at least one leaving group; reacting a second precursor with the germanium compound at a temperature below 300 degrees Celsius; and removing the at least one leaving group from the germanium compound based at least in part on reacting the second precursor with the germanium compound.

Aspect 2: The method, apparatus, or non-transitory computer-readable medium of aspect 1, where the first precursor includes the chemical formula

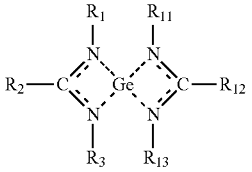

where $R_1$, $R_3$, $R_{11}$, and $R_{13}$ each include at least one of methyl, ethyl, propyl, butyl, secondary butyl, tertiary butyl, iso-propyl, linear alkyl, branched alkyl, or hexyl alkyl; $R_2$ and $R_{12}$ each include at least one of hydrogen, deuterium, methyl, ethyl, propyl, butyl, secondary butyl, tertiary butyl, iso-propyl, linear alkyl, branched alkyl, hexyl alkyl, octyl alkyl, or a dialkylamino; C corresponds to carbon; and N corresponds to nitrogen.

Aspect 3: The method, apparatus, or non-transitory computer-readable medium of aspect 2, where dialkylamino includes a dimethylamino, a diethylamino, or a methylethylamino.

Aspect 4: The method, apparatus, or non-transitory computer-readable medium of any of aspects 2 through 3, where each of $R_1$, $R_3$, $R_{11}$, and $R_{13}$ are ethyl and each of $R_2$ and $R_{12}$ are hydrogen.

Aspect 5: The method, apparatus, or non-transitory computer-readable medium of any of aspects 2 through 4, where each of $R_1$, $R_3$, $R_{11}$, and $R_{13}$ are ethyl and each of $R_2$ and $R_{12}$ are methyl.

Aspect 6: The method, apparatus, or non-transitory computer-readable medium of any of aspects 1 through 5, where the first precursor includes the chemical formula X—Ge (AMD); Ge corresponds to germanium; AMD corresponds to amidinate; X includes an alkoxide, an alkylsulfide, an alkylselenide, an alkyltelluride, an amide including two substituents, a hydrazide including three substituents, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, a halide, or any combination thereof; and the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

Aspect 7: The method, apparatus, or non-transitory computer-readable medium of aspect 6, where the first precursor includes the chemical formula:

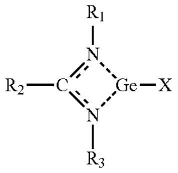

where $R_1$ and $R_3$ each include at least one of methyl, ethyl, propyl, butyl, secondary butyl, tertiary butyl, iso-propyl, linear alkyl, branched alkyl, or hexyl alkyl, where $R_2$ include at least one of hydrogen, deuterium, methyl, ethyl, propyl, butyl, secondary butyl, tertiary butyl, iso-propyl, linear alkyl, branched alkyl, hexyl alkyl, octyl alkyl, where C corresponds to carbon, and where N corresponds to nitrogen.

Aspect 8: The method, apparatus, or non-transitory computer-readable medium of any of aspects 1 through 7, where the second precursor has the chemical formula YH; H is a hydrogen; Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide; and the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

Aspect 9: The method, apparatus, or non-transitory computer-readable medium of any of aspects 1 through 8, where the second precursor has the chemical formula $Y—ZR_1R_2R_3$; Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide; the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents; Z is independently selected from silicon, germanium, or tin; each of $R_1$, $R_2$, and $R_3$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, a $—SiR_aR_bGeR_cR_dR_e$ moiety, or a moiety including carbon atoms, silicon atoms, germanium atoms, or tin atoms, or any combination thereof; each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof; up to 10 atoms of the carbon atoms, silicon atoms, germanium atoms, tin atoms, or any combination thereof are distinct from any carbon atoms, silicon atoms, germanium atoms, or tin atoms of $R_a$ through $R_x$; $R_a$ through $R_x$ are independently selected from hydrogen, deuterium, an alkyl group, or an aryl group; and x of $R_x$ is an index distinct from a of $R_a$.

Aspect 10: The method, apparatus, or non-transitory computer-readable medium of any of aspects 1 through 9, where the reacting occurs at a temperature below 250 degrees Celsius.

Aspect 11: The method, apparatus, or non-transitory computer-readable medium of aspect 10, where the reacting occurs at a temperature below 150 degrees Celsius.

Figure 7:
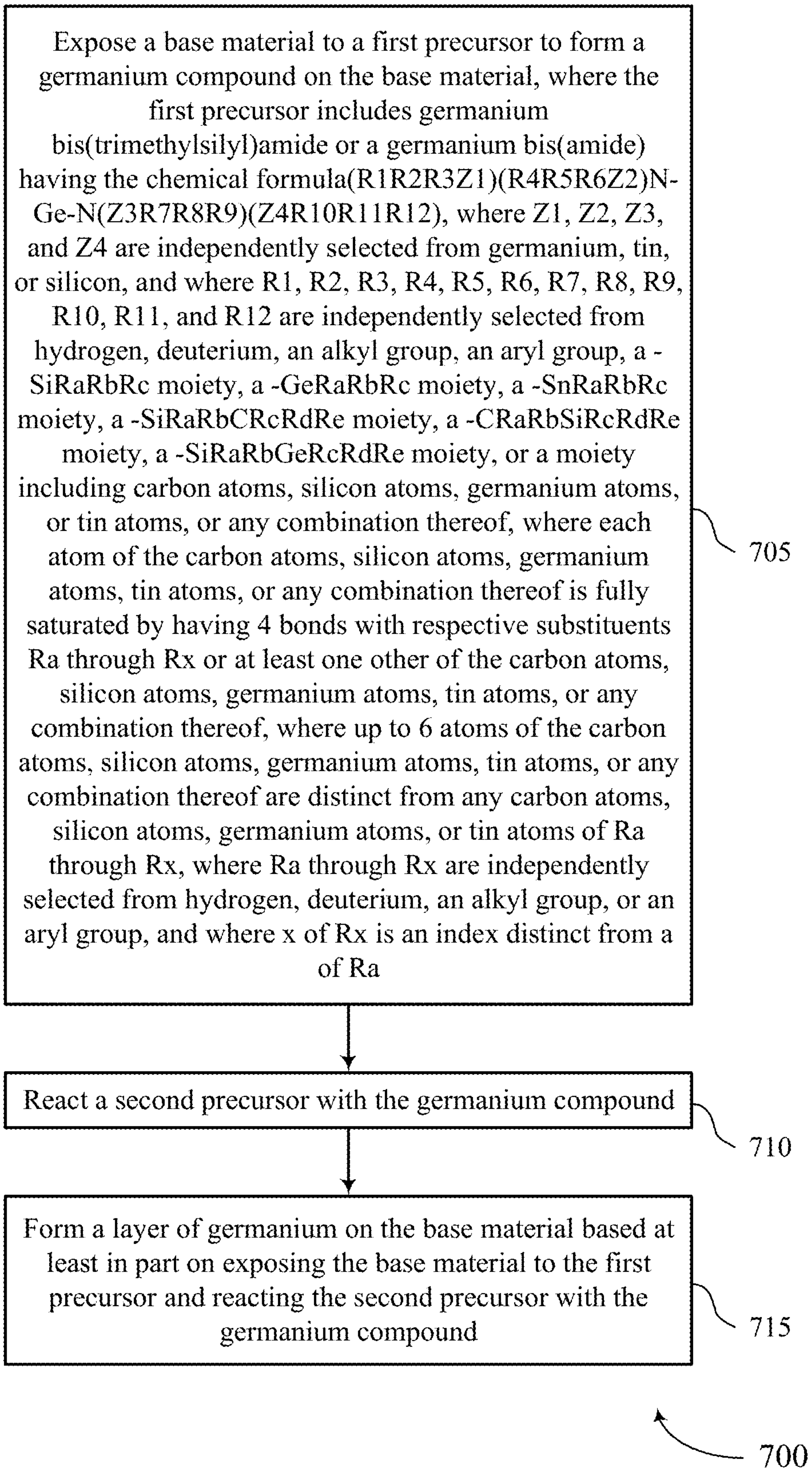

FIG. 7 shows a flowchart illustrating a method 700 that supports methods for depositing germanium films by atomic layer deposition in accordance with examples as disclosed herein. The operations of method 700 may be implemented by a controller or its components as described herein. For example, the operations of method 700 may be performed by a controller as described with reference to FIGS. 1 through 5. In some examples, a controller may execute a set of instructions to control the functional elements of the device to perform the described functions. Additionally, or alternatively, the wireless controller may perform aspects of the described functions using special-purpose hardware.

At 705, the method may include exposing a base material to a first precursor to form a germanium compound on the base material, where the first precursor includes germanium bis(trimethylsilyl)amide or a germanium bis(amide) having the chemical formula $(R_1R_2R_3Z_1)(R_4R_5R_6Z_2)N—Ge—N(Z_3R_7R_8R_9)(Z_4R_{10}R_{11}R_{12})$, where $Z_1$, $Z_2$, $Z_3$, and $Z_4$ are independently selected from germanium, tin, or silicon, and where $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, a $—SiR_aR_bGeR_cR_dR_e$ moiety, or a moiety including carbon atoms, silicon atoms, germanium atoms, or tin atoms, or any combination thereof, where each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof, where up to 6 atoms of the carbon atoms, silicon atoms, germanium atoms, tin atoms, or any combination thereof are distinct from any carbon atoms, silicon atoms, germanium atoms, or tin atoms of $R_a$ through $R_x$, where $R_a$ through $R_x$ are independently selected from hydrogen, deuterium, an alkyl group, or an aryl group, and where x of $R_x$ is an index distinct from a of $R_a$. The operations of 705 may be performed in accordance with examples as disclosed herein. In some examples, aspects of the operations of 705 may be performed by an exposing component 535 as described with reference to FIG. 5.

At 710, the method may include reacting a second precursor with the germanium compound. The operations of 710 may be performed in accordance with examples as disclosed herein. In some examples, aspects of the operations of 710 may be performed by a reacting component 525 as described with reference to FIG. 5.

At 715, the method may include forming a layer of germanium on the base material based at least in part on exposing the base material to the first precursor and reacting the second precursor with the germanium compound. The operations of 715 may be performed in accordance with examples as disclosed herein. In some examples, aspects of the operations of 715 may be performed by a formation component 540 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 12: A method, apparatus, or non-transitory computer-readable medium including operations, features, circuitry, logic, means, or instructions, or any combination thereof for exposing a base material to a first precursor to form a germanium compound on the base material, where the first precursor includes germanium bis(trimethylsilyl) amide or a germanium bis(amide) having the chemical formula $(R_1R_2R_3Z_1)(R_4R_5R_6Z_2)N—Ge—N(Z_3R_7R_8R_9)(Z_4R_{10}R_{11}R_{12})$, where $Z_1$, $Z_2$, $Z_3$, and $Z_4$ are independently selected from germanium, tin, or silicon, and where $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, a $—SiR_aR_bGeR_cR_dR_e$ moiety, or a moiety including carbon atoms, silicon atoms, germanium atoms, or tin atoms, or any combination thereof, where each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof, where up to 6 atoms of the carbon atoms, silicon atoms, germanium atoms, tin atoms, or any combination thereof are distinct from any carbon atoms, silicon atoms, germanium atoms, or tin atoms of $R_a$ through $R_x$, where $R_a$ through $R_x$ are independently selected from hydrogen, deuterium, an alkyl group, or an aryl group, and where x of $R_x$ is an index distinct from a of $R_a$; reacting a second precursor with the germanium compound; and forming a layer of germanium on the base material based at least in part on exposing the base material to the first precursor and reacting the second precursor with the germanium compound.

Aspect 13: The method, apparatus, or non-transitory computer-readable medium of aspect 12, where the second precursor has the chemical formula YH; H is a hydrogen; Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide; and the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

Aspect 14: The method, apparatus, or non-transitory computer-readable medium of any of aspects 12 through 13, where the second precursor has the chemical formula $Y—ZR_1R_2R_3$; Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide; the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents; Z is independently selected from silicon, germanium, or tin; each of $R_1$, $R_2$, and $R_3$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, a $—SiR_aR_bGeR_cR_dR_e$ moiety, or a moiety including carbon atoms, silicon atoms, germanium atoms, or tin atoms, or any combination thereof; each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof; up to 10 atoms of the carbon atoms, silicon atoms, germanium atoms, tin atoms, or any combination thereof are distinct from any carbon atoms, silicon atoms, germanium atoms, or tin atoms of $R_a$ through $R_x$; $R_a$ through $R_x$ are independently selected from hydrogen, deuterium, an alkyl group, or an aryl group; and x of $R_x$ is an index distinct from a of $R_a$.

Figure 8:
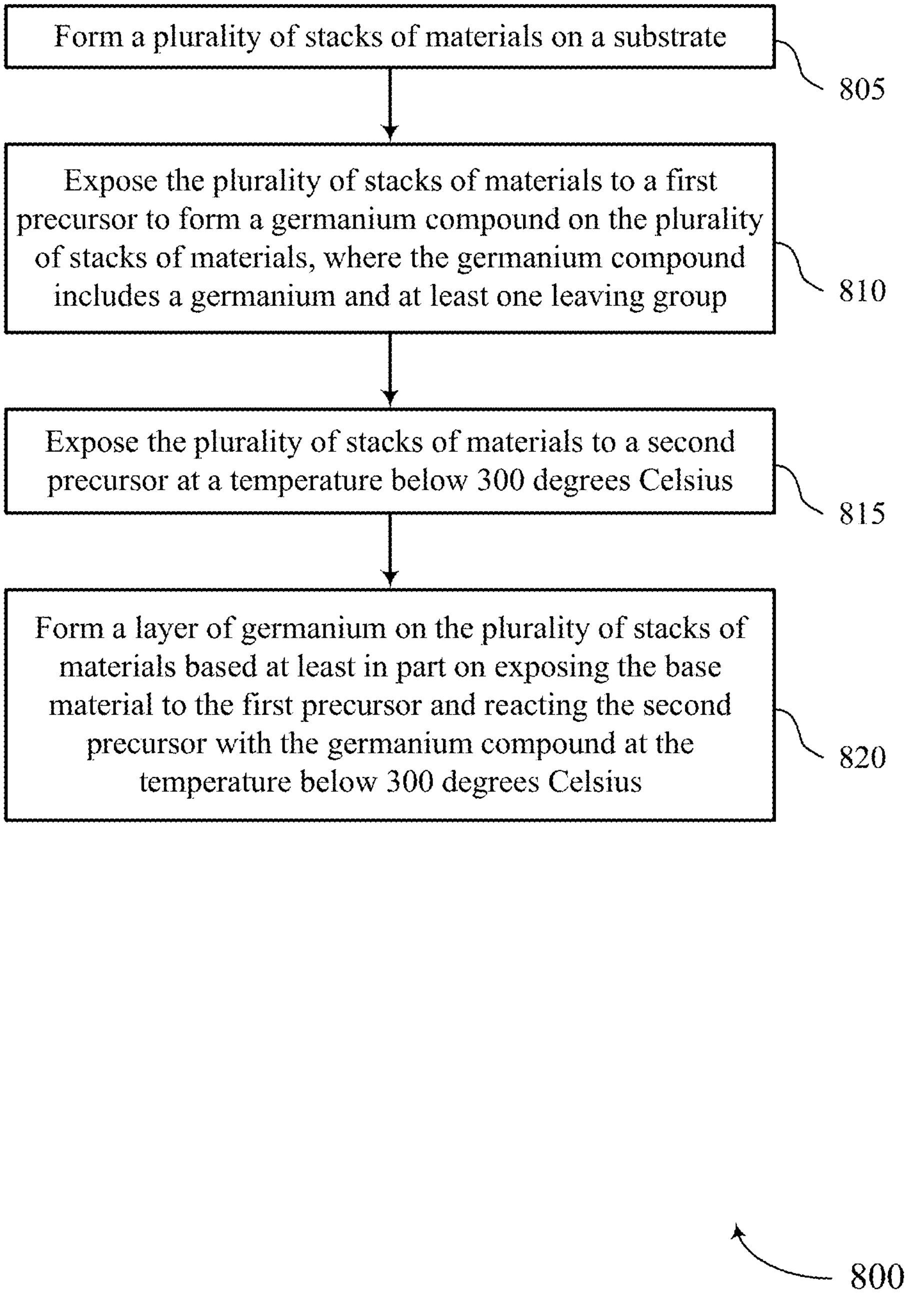

FIG. 8 shows a flowchart illustrating a method 800 that supports methods for depositing germanium films by atomic layer deposition in accordance with examples as disclosed herein. The operations of method 800 may be implemented by a controller or its components as described herein. For example, the operations of method 800 may be performed by a controller as described with reference to FIGS. 1 through 5. In some examples, a controller may execute a set of instructions to control the functional elements of the device to perform the described functions. Additionally, or alternatively, the wireless controller may perform aspects of the described functions using special-purpose hardware.

At 805, the method may include forming a plurality of stacks of materials on a substrate. The operations of 805 may be performed in accordance with examples as disclosed herein. In some examples, aspects of the operations of 805 may be performed by a formation component 540 as described with reference to FIG. 5.

At 810, the method may include exposing the plurality of stacks of materials to a first precursor to form a germanium compound on the plurality of stacks of materials, where the germanium compound includes a germanium and at least one leaving group. The operations of 810 may be performed in accordance with examples as disclosed herein. In some examples, aspects of the operations of 810 may be performed by an exposing component 535 as described with reference to FIG. 5.

At 815, the method may include exposing the plurality of stacks of materials to a second precursor at a temperature below 300 degrees Celsius. The operations of 815 may be performed in accordance with examples as disclosed herein. In some examples, aspects of the operations of 815 may be performed by an exposing component 535 as described with reference to FIG. 5.

At 820, the method may include forming a layer of germanium on the plurality of stacks of materials based at least in part on exposing the plurality of stacks of materials to the first precursor and reacting the second precursor with the germanium compound at the temperature below 300 degrees Celsius. The operations of 820 may be performed in accordance with examples as disclosed herein. In some examples, aspects of the operations of 820 may be performed by a formation component 540 as described with reference to FIG. 5.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 15: A method, apparatus, or non-transitory computer-readable medium including operations, features, circuitry, logic, means, or instructions, or any combination thereof for forming a plurality of stacks of materials on a substrate; exposing the plurality of stacks of materials to a first precursor to form a germanium compound on the plurality of stacks of materials, where the germanium compound includes a germanium and at least one leaving group; exposing the plurality of stacks of materials to a second precursor at a temperature below 300 degrees Celsius; and forming a layer of germanium on the plurality of stacks of materials based at least in part on exposing the plurality of stacks of materials to the first precursor and reacting the second precursor with the germanium compound at the temperature below 300 degrees Celsius.

Aspect 16: The method, apparatus, or non-transitory computer-readable medium of aspect 15, where the first precursor includes the chemical formula:

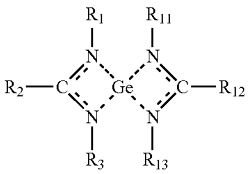

where $R_1$, $R_3$, $R_{11}$, and $R_{13}$ each include at least one of methyl, ethyl, propyl, butyl, secondary butyl, tertiary butyl, iso-propyl, linear alkyl, branched alkyl, or hexyl alkyl; $R_2$ and $R_{12}$ each include at least one of hydrogen, deuterium, methyl, ethyl, propyl, butyl, secondary butyl, tertiary butyl, iso-propyl, linear alkyl, branched alkyl, hexyl alkyl, octyl alkyl, or a dialkylamino; C corresponds to carbon; and N corresponds to nitrogen.

Aspect 17: The method, apparatus, or non-transitory computer-readable medium of aspect 16, where dialkylamino includes a dimethylamino, a diethylamino, or a methylethylamino.

Aspect 18: The method, apparatus, or non-transitory computer-readable medium of any of aspects 16 through 17, where each of $R_1$, $R_3$, $R_{11}$, and $R_{13}$ are ethyl and each of $R_2$ and $R_{12}$ are hydrogen.

Aspect 19: The method, apparatus, or non-transitory computer-readable medium of any of aspects 16 through 18, where each of $R_1$, $R_3$, $R_{11}$, and $R_{13}$ are ethyl and each of $R_2$ and $R_{12}$ are methyl.

Aspect 20: The method, apparatus, or non-transitory computer-readable medium of any of aspects 15 through 19, where the first precursor includes the chemical formula X—Ge(AMD); Ge corresponds to germanium; AMD corresponds to amidinate; X includes an alkoxide, an alkylsulfide, an alkylselenide, an alkyltelluride, an amide including two substituents, a hydrazide including three substituents, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, a halide, or any combination thereof; and the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

Aspect 21: The method, apparatus, or non-transitory computer-readable medium of aspect 20, where the first precursor includes the chemical formula:

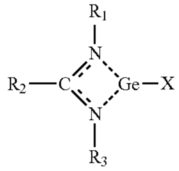

where $R_1$ and $R_3$ each include at least one of methyl, ethyl, propyl, butyl, secondary butyl, tertiary butyl, iso-propyl, linear alkyl, branched alkyl, or hexyl alkyl, where $R_2$ include at least one of hydrogen, deuterium, methyl, ethyl, propyl, butyl, secondary butyl, tertiary butyl, iso-propyl, linear alkyl, branched alkyl, hexyl alkyl, octyl alkyl, where C corresponds to carbon, and where N corresponds to nitrogen.

Aspect 22: The method, apparatus, or non-transitory computer-readable medium of any of aspects 15 through 21, where the second precursor has the chemical formula YH; H is a hydrogen; Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide; and the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents.

Aspect 23: The method, apparatus, or non-transitory computer-readable medium of any of aspects 15 through 22, where the second precursor has the chemical formula $Y—ZR_1R_2R_3$; Y is an amide including two substituents, a hydrazide including three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide; the two substituents of the amide or the three substituents of the hydrazide are selected among an alkyl substituent, a silyl substituent including one or more hydrogen, deuterium, or alkyl substituents, and a germyl substituent including one or more hydrogen, deuterium, or alkyl substituents; Z is independently selected from silicon, germanium, or tin; each of $R_1$, $R_2$, and $R_3$ are independently selected from hydrogen, deuterium, an alkyl group, an aryl group, a $—SiR_aR_bR_c$ moiety, a $—GeR_aR_bR_c$ moiety, a $—SnR_aR_bR_c$ moiety, a $—SiR_aR_bCR_cR_dR_e$ moiety, a $—CR_aR_bSiR_cR_dR_e$ moiety, a $—SiR_aR_bGeR_cR_dR_e$ moiety, or a moiety including carbon atoms, silicon atoms, germanium atoms, or tin atoms, or any combination thereof; each atom of the carbon atoms, silicon atoms, germanium atoms, tin atoms, or any combination thereof is fully saturated by having 4 bonds with respective substituents $R_a$ through $R_x$ or at least one other of the carbon atoms, silicon atoms, germanium atoms, tin atoms, or any combination thereof; up to 10 atoms of the carbon atoms, silicon atoms, germanium atoms, tin atoms, or any combination thereof are distinct from any carbon atoms, silicon atoms, germanium atoms, or tin atoms of $R_a$ through $R_x$; $R_a$ through $R_x$ are independently selected from hydrogen, deuterium, an alkyl group, or an aryl group; and x of $R_x$ is an index distinct from a of $R_a$.

Aspect 24: The method, apparatus, or non-transitory computer-readable medium of any of aspects 15 through 23, where the reacting occurs at a temperature below 250 degrees Celsius.

Aspect 25: The method, apparatus, or non-transitory computer-readable medium of aspect 24, where the reacting occurs at a temperature below 150 degrees Celsius.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99% met, or at least 99.9% met.

As used herein, spatially relative terms, such as "adjacent," "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one or ordinary skill in the art. The materials may be otherwise oriented (e.g., rotated 90 degrees, inverted, flipped), and the spatially relative descriptors used herein interpreted accordingly.

As used herein, the term "electronic device" may include, without limitation, a memory device, as well as semiconductor devices, which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may be a 3D electronic device, such as a 3D dynamic random access memory (DRAM) memory device, a 3D crosspoint memory device, or a 3D phase-change random access memory (PCRAM) memory device.

As used herein, the term "substrate" means and includes a foundation material or construction upon which components, such as those within a semiconductor device or electronic device are formed. The substrate may be a semiconductor substrate, a base material, a base semiconductor material on a supporting structure, a metal electrode, or a semiconductor substrate having one or more materials, structures, or regions formed thereon. The substrate may be a conventional silicon substrate, or other bulk substrate including a semiconductive material. As used herein, the term "bulk substrate" means and includes not only silicon wafers, but also silicon-on insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

reacting a first precursor with a base material to form a germanium compound on the base material, wherein the first precursor comprises germanium in a (+2) oxidation state and wherein the germanium compound comprises germanium and at least one leaving group;

reacting a second precursor with the germanium compound at a temperature below 300 degrees Celsius; and removing the at least one leaving group from the germanium compound based at least in part on reacting the second precursor with the germanium compound, wherein removing at least one leaving group leads to a disproportionation reaction in which a first portion of germanium atoms in the germanium compound is reduced to a zero oxidation state and deposited on the base material and a second portion of the germanium atoms in the germanium compound is oxidized to a (+4) oxidation state and removed as a byproduct.

2. The method of claim 1, wherein the first precursor comprises the chemical formula:

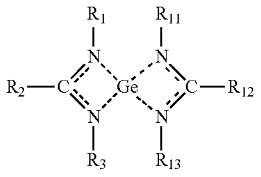

wherein R1, R3, R11, and R13 each comprise at least one of methyl, ethyl, propyl, butyl, secondary butyl, tertiary butyl, iso-propyl, linear alkyl, branched alkyl, or hexyl alkyl, wherein R2 and R12 each comprise at least one of hydrogen, deuterium, methyl, ethyl, propyl, butyl, secondary butyl, tertiary butyl, iso-propyl, linear alkyl, branched alkyl, hexyl alkyl, octyl alkyl, or a dialkylamino, wherein C corresponds to carbon, and wherein N corresponds to nitrogen.

3. The method of claim 2, wherein dialkylamino comprises a dimethylamino, a diethylamino, or a methylethylamino.

4. The method of claim 2, wherein:

each of R1, R3, R11, and R13 are ethyl; and each of R2 and R12 are hydrogen.

5. The method of claim 2, wherein:

each of R1, R3, R11, and R13 are ethyl; and each of R2 and R12 are methyl.

6. The method of claim 1, wherein:

the first precursor comprises the chemical formula X—Ge (AMD);

Ge corresponds to germanium;

AMD corresponds to amidinate; and

X comprises an alkoxide, an alkylsulfide, an alkylselenide, an alkyltelluride, an amide comprising two substituents, a hydrazide comprising three substituents, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, a halide, or any combination thereof, wherein the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents.

7. The method of claim 6, wherein the first precursor comprises the chemical formula:

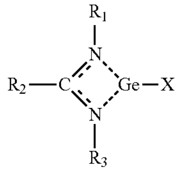

wherein R1 and R3 each comprise at least one of methyl, ethyl, propyl, butyl, secondary butyl, tertiary butyl, iso-propyl, linear alkyl, branched alkyl, or hexyl alkyl, wherein R2 comprise at least one of hydrogen, deuterium, methyl, ethyl, propyl, butyl, secondary butyl, tertiary butyl, iso-propyl, linear alkyl, branched alkyl, hexyl alkyl, octyl alkyl, wherein C corresponds to carbon, and wherein N corresponds to nitrogen.

8. The method of claim 1, wherein:

the second precursor has the chemical formula YH;

H is a hydrogen; and

Y is an amide comprising two substituents, a hydrazide comprising three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide, wherein the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents.

9. The method of claim 1, wherein:

the second precursor has the chemical formula Y—ZR1R2R3;

Y is an amide comprising two substituents, a hydrazide comprising three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide;

the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents;

Z is independently selected from silicon, germanium, or tin; and each of R1, R2, and R3 are independently selected from hydrogen, deuterium, an alkyl group, an aryl group, a —SiRaRbRc moiety, a —GeRaRbRc moiety, a —Sn- RaRbRc moiety, a —SiRaRbCRcRdRe moiety, a —CRaRbSiRcRdRe moiety, a —SiRaRbGeRcRdRe moiety, or a moiety comprising carbon atoms, silicon atoms, germanium atoms, or tin atoms, or any combination thereof, wherein each atom of the carbon atoms, silicon atoms, germanium atoms, tin atoms, or any combination thereof is fully saturated by having 4 bonds with respective substituents Ra through Rx or at least one other of the carbon atoms, silicon atoms, germanium atoms, tin atoms, or any combination thereof, wherein up to 10 atoms of the carbon atoms, silicon atoms, germanium atoms, tin atoms, or any combination thereof are distinct from any carbon atoms, silicon atoms, germanium atoms, or tin atoms of Ra through Rx, wherein Ra through Rx are independently selected from hydrogen, deuterium, an alkyl group, or an aryl group, and wherein x of Rx is an index distinct from a of Ra.

10. The method of claim 1, wherein the reacting occurs at a temperature below 250 degrees Celsius.

11. The method of claim 10, wherein the reacting occurs at a temperature below 150 degrees Celsius.

12. A method, comprising:

exposing a base material to a first precursor to form a germanium compound on the base material, wherein the first precursor comprises germanium bis(trimethylsilyl)amide or a germanium bis(amide) having the chemical formula (R1R2R3Z1)(R4R5R6Z2)N—Ge—N(Z3R7R8R9)(Z4R10R11R12) and comprises germanium in a (+2) oxidation state, wherein Z1, Z2, Z3, and Z4 are independently selected from germanium, tin, or silicon, and wherein R1, R2, R3, R4, R5, R6, R7, R8, R9, R10, R11, and R12 are independently selected from hydrogen, deuterium, an alkyl group, an aryl group, a —SiRaRbRc moiety, a —GeRaRbRc moiety, a —SnRaRbRc moiety, a —SiRaRbCRcRdRe moiety, a —CRaRbSiRcRdRe moiety, a —SiRaRbGeRcRdRe moiety, or a moiety comprising carbon atoms, silicon atoms, germanium atoms, or tin atoms, or any combination thereof, wherein each atom of the carbon atoms, silicon atoms, germanium atoms, tin atoms, or any combination thereof is fully saturated by having 4 bonds with respective substituents Ra through Rx or at least one other of the carbon atoms, silicon atoms, germanium atoms, tin atoms, or any combination thereof, wherein up to 6 atoms of the carbon atoms, silicon atoms, germanium atoms, tin atoms, or any combination thereof are distinct from any carbon atoms, silicon atoms, germanium atoms, or tin atoms of Ra through Rx, wherein Ra through Rx are independently selected from hydrogen, deuterium, an alkyl group, or an aryl group, and wherein x of Rx is an index distinct from a of Ra;

reacting a second precursor with the germanium compound; and forming a layer of germanium on the base material based at least in part on exposing the base material to the first precursor and reacting the second precursor with the germanium compound, wherein forming the layer of germanium removes at least one leaving group and leads to a disproportionation reaction in which a first portion of germanium atoms in the germanium compound is reduced to a zero oxidation state and deposited on the base material and a second portion of the germanium atoms in the germanium compound is oxidized to a (+4) oxidation state and removed as a byproduct.

13. The method of claim 12, wherein:

the second precursor has the chemical formula YH;

H is a hydrogen; and

Y is an amide comprising two substituents, a hydrazide comprising three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide, wherein the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents.

14. The method of claim 12, wherein:

the second precursor has the chemical formula Y—ZR1R2R3;

Y is an amide comprising two substituents, a hydrazide comprising three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide;

the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents;

Z is independently selected from silicon, germanium, or tin; and each of R1, R2, and R3 are independently selected from hydrogen, deuterium, an alkyl group, an aryl group, a —SiRaRbRc moiety, a —GeRaRbRc moiety, a —SnRaRbRc moiety, a —SiRaRbCRcRdRe moiety, a —CRaRbSiRcRdRe moiety, a —SiRaRbGeRcRdRe moiety, or a moiety comprising carbon atoms, silicon atoms, germanium atoms, or tin atoms, or any combination thereof, wherein each atom of the carbon atoms, silicon atoms, germanium atoms, tin atoms, or any combination thereof is fully saturated by having 4 bonds with respective substituents Ra through Rx or at least one other of the carbon atoms, silicon atoms, germanium atoms, tin atoms, or any combination thereof, wherein up to 10 atoms of the carbon atoms, silicon atoms, germanium atoms, tin atoms, or any combination thereof are distinct from any carbon atoms, silicon atoms, germanium atoms, or tin atoms of Ra through Rx, wherein Ra through Rx are independently selected from hydrogen, deuterium, an alkyl group, or an aryl group, and wherein x of Rx is an index distinct from a of Ra.

15. A method, comprising:

forming a plurality of stacks of materials on a substrate;

exposing the plurality of stacks of materials to a first precursor to form a germanium compound on the plurality of stacks of materials, wherein the first precursor comprises germanium in a (+2) oxidation state and wherein the germanium compound comprises a germanium and at least one leaving group;

exposing the plurality of stacks of materials to a second precursor at a temperature below 300 degrees Celsius; and forming a layer of germanium on the plurality of stacks of materials based at least in part on exposing the plurality of stacks of materials to the first precursor and reacting the second precursor with the germanium compound at the temperature below 300 degrees Celsius, wherein forming the layer of germanium removes the at least one leaving group and leads to a disproportionation reaction in which a first portion of germanium atoms in the germanium compound is reduced to a zero oxidation state and deposited on the plurality of stacks of materials and a second portion of the germanium atoms in the germanium compound is oxidized to a (+4) oxidation state and removed as a byproduct.

16. The method of claim 15, wherein the first precursor comprises the chemical formula:

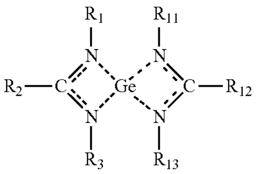

wherein R1, R3, R11, and R13 each comprise at least one of methyl, ethyl, propyl, butyl, secondary butyl, tertiary butyl, iso-propyl, linear alkyl, branched alkyl, or hexyl alkyl, wherein R2 and R12 each comprise at least one of hydrogen, deuterium, methyl, ethyl, propyl, butyl, secondary butyl, tertiary butyl, iso-propyl, linear alkyl, branched alkyl, hexyl alkyl, octyl alkyl, or a dialkylamino, wherein C corresponds to carbon, and wherein N corresponds to nitrogen.

17. The method of claim 16, wherein dialkylamino comprises a dimethylamino, a diethylamino, or a methylethylamino.

18. The method of claim 16, wherein:

each of R1, R3, R11, and R13 are ethyl; and each of R2 and R12 are hydrogen.

19. The method of claim 16, wherein:

each of R1, R3, R11, and R13 are ethyl; and each of R2 and R12 are methyl.

20. The method of claim 15, wherein:

the first precursor comprises the chemical formula X—Ge (AMD);

Ge corresponds to germanium;

AMD corresponds to amidinate, and

X comprises an alkoxide, an alkylsulfide, an alkylselenide, an alkyltelluride, an amide comprising two substituents, a hydrazide comprising three substituents, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, a halide, or any combination thereof, wherein the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents.

21. The method of claim 20, wherein the first precursor comprises the chemical formula:

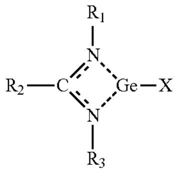

wherein R1 and R3 each comprise at least one of methyl, ethyl, propyl, butyl, secondary butyl, tertiary butyl, iso-propyl, linear alkyl, branched alkyl, or hexyl alkyl, wherein R2 comprise at least one of hydrogen, deuterium, methyl, ethyl, propyl, butyl, secondary butyl, tertiary butyl, iso-propyl, linear alkyl, branched alkyl, hexyl alkyl, octyl alkyl, wherein C corresponds to carbon, and wherein N corresponds to nitrogen.

22. The method of claim 15, wherein the second precursor has the chemical formula YH, wherein His a hydrogen, and wherein Y is an amide comprising two substituents, a hydrazide comprising three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide, wherein the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents.

23. The method of claim 15, wherein the second precursor has the chemical formula Y—ZR1R2R3, wherein Y is an amide comprising two substituents, a hydrazide comprising three substituents, an alkoxy, a silyloxy, a trimethylsiyloxy, a germyloxy, a trimethylgermyloxy, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, an isofulminate, or a halide, wherein the two substituents of the amide or the three substituents of the hydrazide are selected among an alkyl substituent, a silyl substituent comprising one or more hydrogen, deuterium, or alkyl substituents, and a germyl substituent comprising one or more hydrogen, deuterium, or alkyl substituents, wherein Z is independently selected from silicon, germanium, or tin, and wherein each of R1, R2, and R3 are independently selected from hydrogen, deuterium, an alkyl group, an aryl group, a —SiRaRbRc moiety, a —GeRaRbRc moiety, a —SnRaRbRc moiety, a —SiRaRbCRcRdRe moiety, a —CRaRbSiRcRdRe moiety, a —SiRaRbGeRcRdRe moiety, or a moiety comprising carbon atoms, silicon atoms, germanium atoms, or tin atoms, or any combination thereof, wherein each atom of the carbon atoms, silicon atoms, germanium atoms, tin atoms, or any combination thereof is fully saturated by having 4 bonds with respective substituents Ra through Rx or at least one other of the carbon atoms, silicon atoms, germanium atoms, tin atoms, or any combination thereof, wherein up to 10 atoms of the carbon atoms, silicon atoms, germanium atoms, tin atoms, or any combination thereof are distinct from any carbon atoms, silicon atoms, germanium atoms, or tin atoms of Ra through Rx, wherein Ra through Rx are independently selected from hydrogen, deuterium, an alkyl group, or an aryl group, and wherein x of Rx is an index distinct from a of Ra.

24. The method of claim 15, wherein the reacting occurs at a temperature below 250 degrees Celsius.

25. The method of claim 24, wherein the reacting occurs at a temperature below 150 degrees Celsius.

* * * * *